US011444586B2

(12) United States Patent
Roberts et al.

(10) Patent No.: US 11,444,586 B2
(45) Date of Patent: Sep. 13, 2022

(54) RF AMPLIFIERS WITH INPUT-SIDE FRACTIONAL HARMONIC RESONATOR CIRCUITS

(71) Applicant: NXP USA, Inc., Austin, TX (US)

(72) Inventors: Jeffrey Spencer Roberts, Tempe, AZ (US); Ning Zhu, Chandler, AZ (US); Damon g. Holmes, Scottsdale, AZ (US); Jeffrey Kevin Jones, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/667,068

(22) Filed: Oct. 29, 2019

(65) Prior Publication Data

US 2021/0126593 A1 Apr. 29, 2021

(51) Int. Cl.
*H03F 3/191* (2006.01)
*H03F 1/56* (2006.01)
*H03F 1/02* (2006.01)
*H03F 3/195* (2006.01)

(52) U.S. Cl.
CPC ........... *H03F 1/565* (2013.01); *H03F 1/0288* (2013.01); *H03F 3/195* (2013.01); *H03F 2200/391* (2013.01)

(58) Field of Classification Search
CPC ........................................................ H03F 3/191
USPC .................................................. 330/302, 305
See application file for complete search history.

(56) References Cited

U.S. PATENT DOCUMENTS

| 8,659,359 | B2 | 2/2014 | Ladhani et al. |
| 9,692,363 | B2 | 6/2017 | Zhu et al. |
| 10,270,402 | B1 | 4/2019 | Holmes et al. |
| 2002/0118067 | A1* | 8/2002 | Hirayama ............... H03F 3/191 330/302 |
| 2021/0021237 | A1* | 1/2021 | Hill ....................... H03F 1/0288 |

OTHER PUBLICATIONS

U.S. Appl. No. 15/983,974; Not Yet Published; 50 pages filed May 18, 2018.
U.S. Appl. No. 15/984,137; not yet published; 64 pages filed May 18, 2018.
U.S. Appl. No. 16/230,624; not yet published; 49 pages filed Dec. 21, 2018.

* cited by examiner

*Primary Examiner* — Henry Choe
(74) *Attorney, Agent, or Firm* — Sherry Gourlay

(57) ABSTRACT

A radio frequency amplifier includes a transistor, an input impedance matching circuit (e.g., a single-section T-match circuit or a multiple-section bandpass circuit), and a fractional harmonic resonator circuit. The input impedance matching circuit is coupled between an amplification path input and a transistor input terminal. An input of the fractional harmonic resonator circuit is coupled to the amplification path input, and an output of fractional harmonic resonator circuit is coupled to the transistor input terminal. The fractional harmonic resonator circuit is configured to resonate at a resonant frequency that is between a fundamental frequency of operation of the RF amplifier and a second harmonic of the fundamental frequency. According to a further embodiment, the fractional harmonic resonator circuit resonates at a fraction, x, of the fundamental frequency, wherein the fraction is between about 1.25 and about 1.9 (e.g., $x \approx 1.5$).

20 Claims, 10 Drawing Sheets

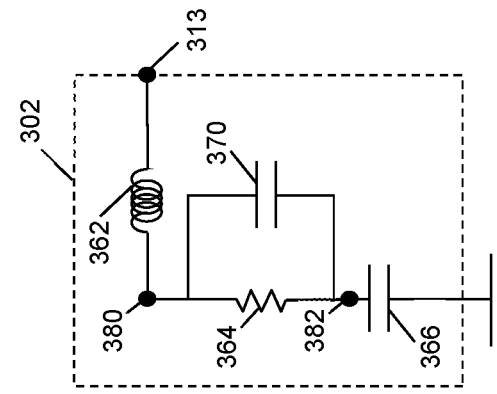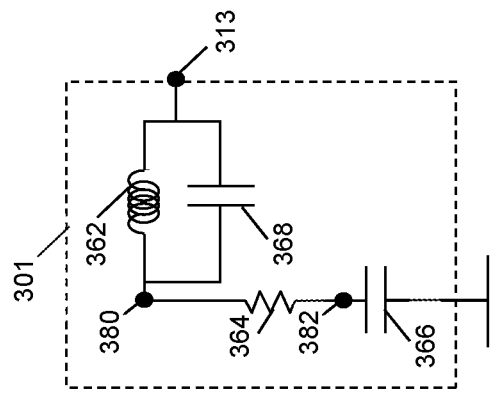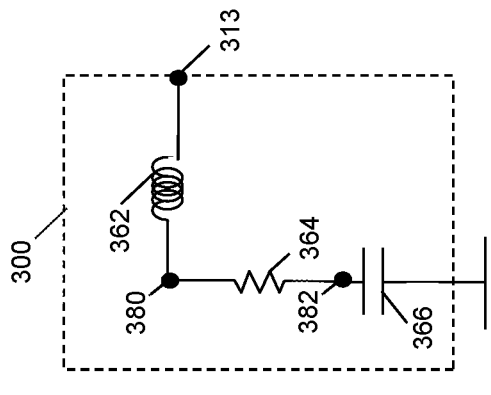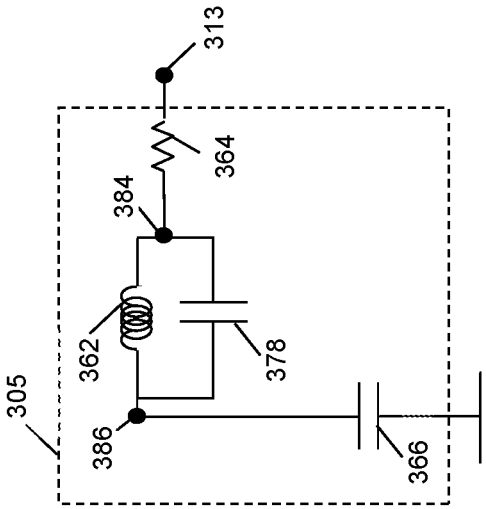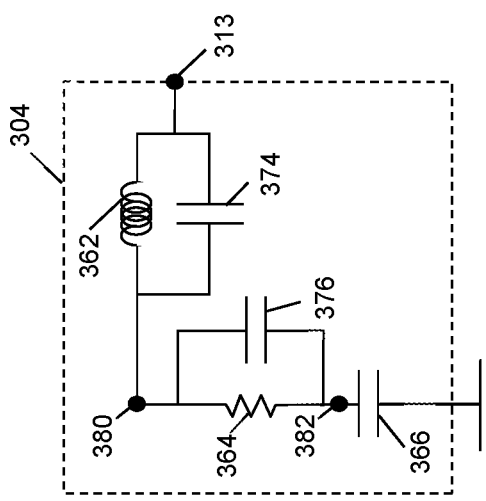

RF AMPLIFIERS WITH INPUT-SIDE FRACTIONAL HARMONIC RESONATOR CIRCUITS

TECHNICAL FIELD

Embodiments of the subject matter described herein relate generally to radio frequency (RF) amplifiers, and more particularly to broadband power amplifier devices and packaged devices.

BACKGROUND

Wireless communication systems employ power amplifiers for increasing the power of radio frequency (RF) signals. In a cellular base station, for example, a Doherty power amplifier may form a portion of the last amplification stage in a transmission chain before provision of the amplified signal to an antenna for radiation over the air interface. High gain, high linearity, stability, and a high level of power-added efficiency are characteristics of a desirable power amplifier in such a wireless communication system.

In the field of power amplifier device design, it is becoming increasingly desirable to achieve concurrent multi-band, broadband amplification. To successfully design a wideband power amplifier device for concurrent multi-band, broadband operation in a Doherty power amplifier circuit, for example, it is desirable to enable a good broadband fundamental match (e.g., over 20 percent fractional bandwidth) to appropriately handle harmonic frequency interactions, while also enabling a wide video bandwidth. However, achieving these goals continues to provide challenges to power amplifier device designers.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 3A, 3B, 3C, 3D, 3E, and 3F illustrate various example embodiments of baseband termination circuits;

DETAILED DESCRIPTION

Figure 1:
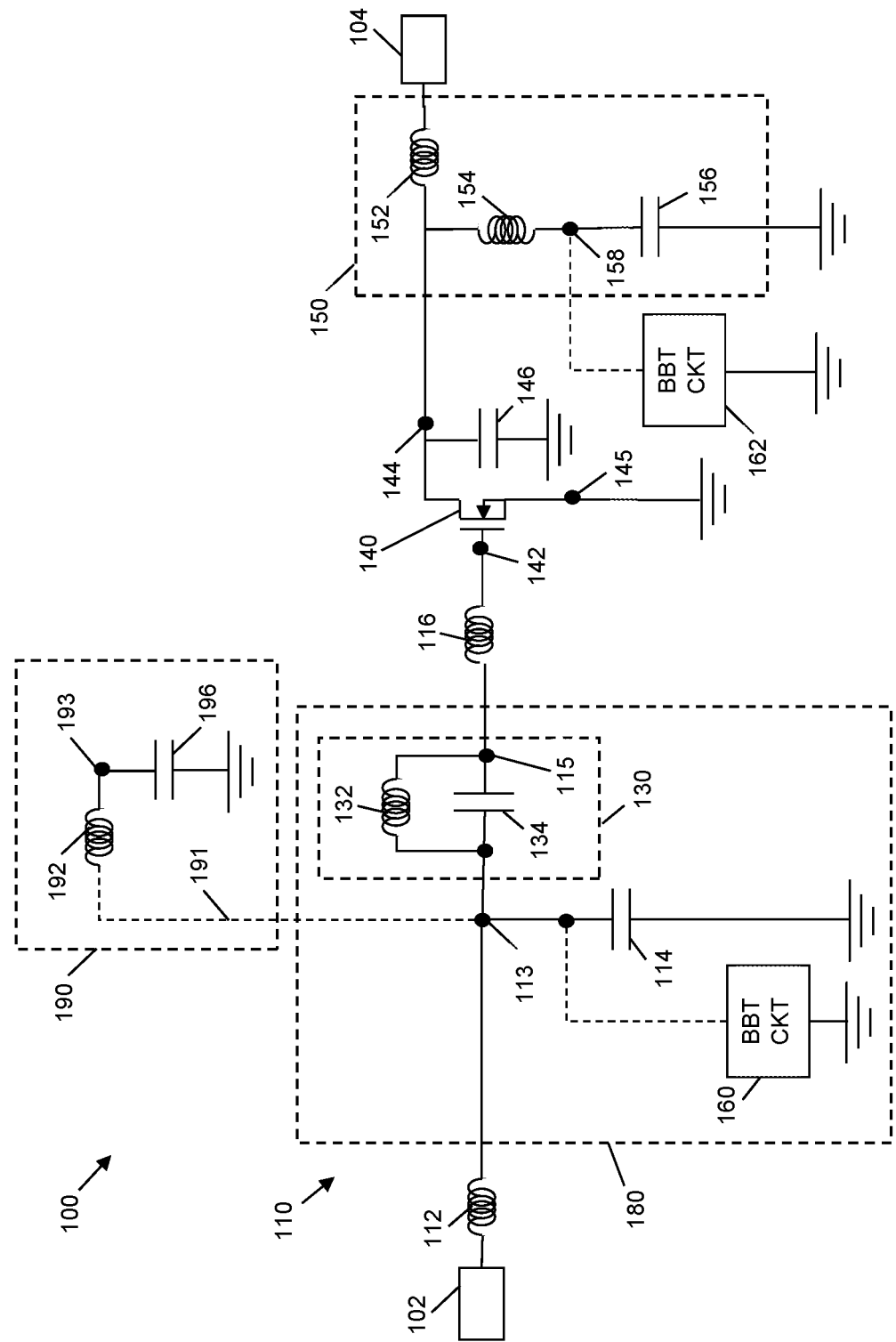
FIG. 1 is a schematic circuit diagram of a power amplifier circuit with a single-section, input T-match topology and a fractional harmonic resonator, in accordance with one or more example embodiments.

In the field of high-power radio frequency (RF) power amplification for cellular base stations and other applications (e.g., where "RF," in this application, includes frequencies in a range of 1 megahertz (MHz) to 100 gigahertz (GHz)), broadband power amplification using silicon-based devices (e.g., laterally diffused metal oxide semiconductor (LDMOS) power transistor devices with output matching networks) has been successfully achieved. However, such silicon-based devices exhibit relatively low efficiencies and power densities when compared with the efficiencies and power densities of gallium nitride (GaN)-based power amplifier devices. Accordingly, GaN-based power amplifier devices have been increasingly considered for high power broadband applications. However, there are challenges to using GaN technology to achieve broadband power amplification (e.g., over 20 percent fractional bandwidth, where "fractional bandwidth" is the bandwidth of an amplifier divided by its center frequency of operation).

For example, the nonlinear input capacitance of RF power devices, including GaN transistors (e.g., GaN field effect transistors (FETs)), is known to generate harmonics and intermodulation distortion that can impair efficiency and linearity. In addition, the source second harmonic impedance can dramatically impact drain efficiency. Without the information of second harmonic impedance at the current source terminal plane, it is very difficult to tune a power amplifier (e.g., using digital pre-distortion, or DPD) to achieve relatively high fractional bandwidth with good performance (e.g., high efficiency and linearity).

To overcome these and other challenges in designing broadband power amplifiers, including those that use GaN-based devices, embodiments disclosed herein may achieve broadband input impedance matching at a fundamental frequency, f0, using an input-side impedance matching circuit that has a single-section T-match topology or a multiple-section (e.g., two-section) bandpass topology. Further, to generate a low impedance condition (emulating a short circuit) near a second harmonic frequency, 2f0, a fractional harmonic resonator circuit (also referred to simply as a "harmonic resonator") is added close to the input of the RF power device. According to various embodiments, the harmonic resonator is "fractional" in that it resonates at a fraction of a harmonic frequency that is below the second harmonic frequency operating band, but above the fundamental frequency band (i.e., the harmonic resonator resonates at a frequency between the fundamental frequency and the second harmonic frequency).

According to an embodiment, the fractional harmonic resonator circuit is a parallel inductor-capacitor (LC) resonator circuit. For example, some specific embodiments of the inventive subject matter include a fractional harmonic resonator that includes a capacitance (e.g., an integrated metal-insulator-metal (MIM) capacitor) and an inductance (e.g., in the form of a bond wire array or an integrated spiral inductor) parallel-coupled between the amplifier input and the input (e.g., gate terminal) of the RF power device. The fractional harmonic resonator may be placed within an input-side impedance matching circuit (e.g., including T-match and bandpass topologies). The component values of the fractional harmonic resonator are selected so that, below the resonant frequency of the fractional harmonic resonator, the fractional harmonic resonator will emulate an inductance, which makes the input matching circuit topology appear to be a typical matching circuit (e.g., T-match topology) in the fundamental frequency band. In the second harmonic frequency band, however, the fractional harmonic resonator will emulate a capacitance, which, when properly designed, can provide a low impedance termination at the input of the RF power device. The fractional harmonic resonator embodiments described herein may be used to control the second harmonic impedance across a wide (e.g., 20 percent plus) fractional bandwidth at relatively low impedance (e.g., close to short circuit). This may be useful in achieving relatively high efficiency for broadband applications.

FIG. 1 is a schematic diagram of an RF power amplifier circuit 100 with a single-section, input T-match topology 110 and a fractional harmonic resonator (FHR) circuit 130, in accordance with an example embodiment. Amplifier circuit 100 includes an input 102 (e.g., a first conductive package lead), an input impedance matching circuit 110, an FHR circuit 130, a transistor 140, an output impedance matching circuit 150, and an output 104 (e.g., a second conductive package lead), in an embodiment. Each of the input and output 102, 104 may be more generally referred to as an "RF input/output (I/O)."

The input impedance matching circuit 110 and FHR circuit 130 may be referred to collectively as an "input circuit." Similarly, the output impedance matching circuit 150 may be referred to as an "output circuit." As will be described in more detail in conjunction with FIGS. 5-7, many of the elements making up the input impedance matching circuit 110 and FHR circuit 130, and specifically those elements encompassed by dashed box 180, may be included in and/or on an integrated passive device (IPD), such as IPD 580, 581, FIGS. 5-7, or in and/or on another type of substrate (e.g., a small PCB or other type of substrate).

Although transistor 140, various elements of the input and output impedance matching circuits 110, 150, and the FHR circuit 130 are shown as singular components, the depiction is for the purpose of ease of explanation only. Those of skill in the art would understand, based on the description herein, that transistor 140 and/or certain elements of the input impedance matching circuit 110, the FHR circuit 130, and the output impedance matching circuit 150 each may be implemented as multiple components (e.g., connected in parallel or in series with each other). The description of transistor 140 and various elements of the input impedance matching circuit 110, the FHR circuit 130, and the output impedance matching circuit 150, below, thus are not intended to limit the scope of the inventive subject matter only to the illustrated embodiments.

Input 102 and output 104 each may include a conductor, which is configured to enable the amplifier circuit 100 to be electrically coupled with external circuitry (not shown). More specifically, the input and output 102, 104 are physically positioned to span between the exterior and the interior of a device package, in an embodiment. Input impedance matching circuit 110 and FHR circuit 130 are electrically coupled between the input 102 and a first terminal 142 of transistor 140 (e.g., the gate terminal). Similarly, the output impedance matching circuit 150 is electrically coupled between a second terminal 144 of transistor 140 (e.g., the drain terminal) and the output 104. A third terminal 145 of transistor 140 (e.g., the source terminal) is coupled to a ground reference node.

According to an embodiment, transistor 140 is the primary active component of amplifier circuit 100. Transistor 140 includes a control terminal 142 and two current conducting terminals 144, 145, where the current conducting terminals 144, 145 are spatially and electrically separated by a variable-conductivity channel. For example, transistor 140 may be a field effect transistor (FET), which includes a gate terminal (control terminal 142), a drain terminal (a first current conducting terminal 144), and a source terminal (a second current conducting terminal 145). According to an embodiment, and using nomenclature typically applied to FETs in a non-limiting manner, the input terminal 142 of transistor 140 is coupled to the input impedance matching circuit 110 and the FHR circuit 130, the drain terminal 144 of transistor 140 is coupled to the output impedance matching circuit 150, and the source terminal 145 of transistor 140 is coupled to ground (or another voltage reference). Through the variation of control signals provided to the gate terminal of transistor 140, the current between the current conducting terminals of transistor 140 may be modulated.

According to various embodiments, transistor 140 is a III-V field effect transistor (e.g., a high electron mobility transistor (HEMT)), which has a relatively low drain-source capacitance, Cds, when compared with a silicon-based FET (e.g., an LDMOS FET). For example, in some embodiments, transistor 140 may be a GaN FET, although in other embodiments, transistor 140 may be another type of III-V transistor (e.g., gallium arsenide (GaAs), gallium phosphide (GaP), indium phosphide (InP), or indium antimonide (InSb)), or another type of transistor that has a relatively low drain-source capacitance. In FIG. 1, the drain-source capacitance of transistor 140 is represented with shunt capacitor 146 connected between the drain terminal of transistor 140 and a transistor output terminal 144. Those of skill in the art would understand, based on the description herein, that capacitor 146 is not a physical component, but instead models the drain-source capacitance of transistor 140. According to an embodiment, transistor 140 may have a drain-source capacitance that is less than about 0.2 picofarads per Watt (pF/W).

As mentioned above, the input impedance matching circuit 110 and FHR circuit 130 are electrically coupled between the input 102 and an input terminal 142 (e.g., a gate terminal) of transistor 140. Input impedance matching circuit 110 is configured to transform (e.g., raise) the gate impedance of transistor 140 to a higher (e.g., intermediate or higher) impedance level (e.g., in a range from about 2 to about 10 ohms or higher) at node 102. This is advantageous in that it allows the printed circuit board (PCB) level matching interface from a driver stage to have an impedance that can be achieved in high-volume manufacturing with minimal loss and variation (e.g., a "user friendly" matching interface).

According to an embodiment, the input impedance matching circuit 110 is a single section T-match circuit, which includes a first inductive element 112, a shunt capacitance 114, and a second inductive element 116. As illustrated in FIG. 1, the FHR circuit 130, which will be described in more detail later, is implemented within the input impedance matching circuit 110, and more specifically between the first and second inductive elements 112, 116.

In the input impedance matching circuit 110, the first inductive element 112 (e.g., a first set of bond wires) is coupled between input 102 and a node 113 (also referred to as a "connection node"). More specifically, a first terminal of inductive element 112 (e.g., first ends of the first set of bond wires) is connected to input 102, and a second terminal of inductive element 112 (e.g., second ends of the first set of bond wires) is connected to the node 113. The second inductive element 116 (e.g., a second set of bond wires) is coupled between the node 113 and the input terminal 142 of transistor 140. More specifically, a first terminal of inductive element 116 (e.g., first ends of the second set of bond wires) is coupled (indirectly) to the node 113, and a second terminal of inductive element 116 (e.g., second ends of the second set of bond wires) is connected to the control terminal 142. Finally, shunt capacitance 114 is coupled between node 113 and ground (or another voltage reference. More specifically, a first terminal of shunt capacitance 114 is coupled to node 113, and a second terminal of shunt capacitance 114 is coupled to ground.

Figure 2:
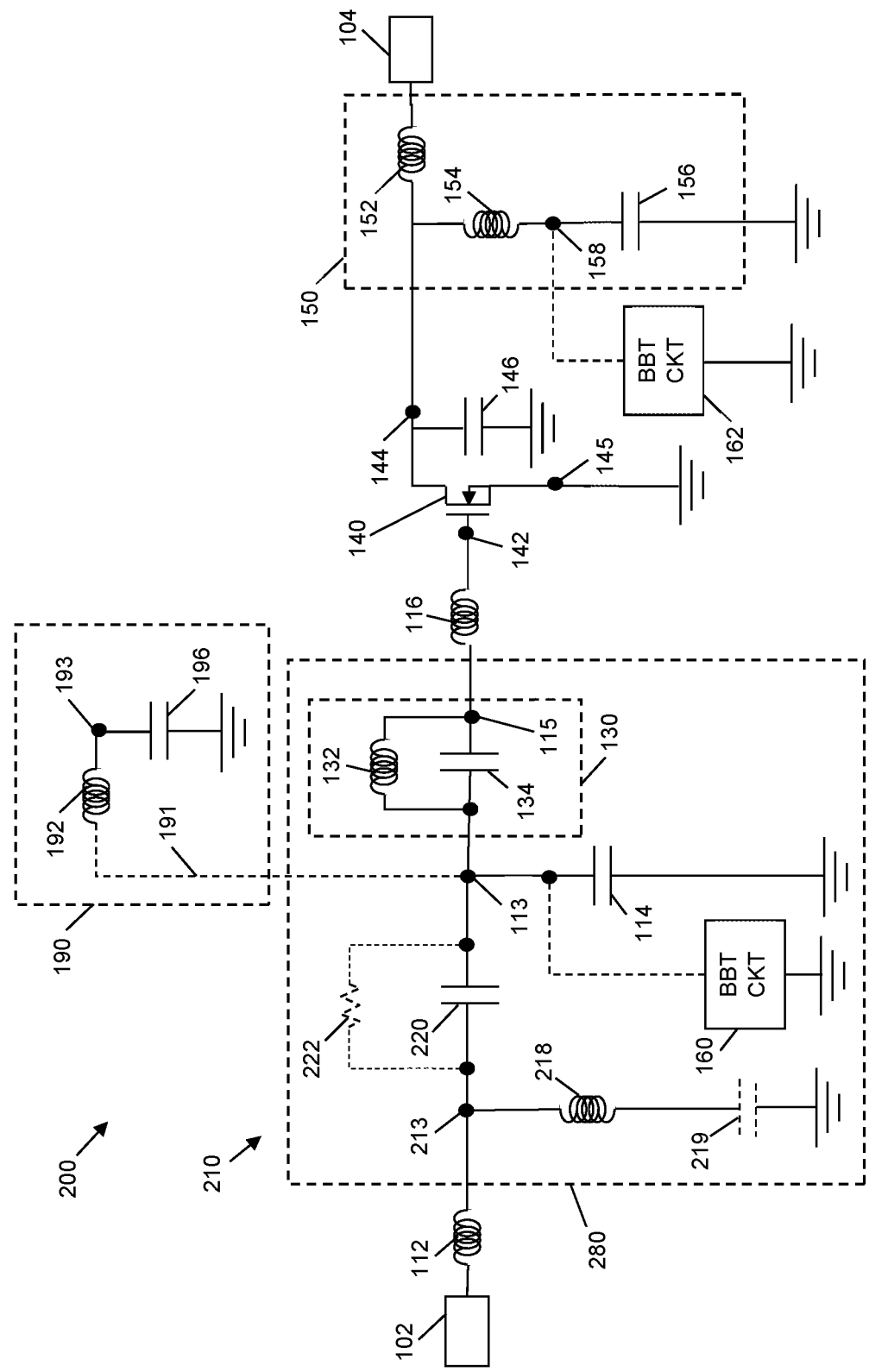
FIG. 2 is a schematic circuit diagram of a power amplifier circuit with a two-section, input bandpass topology and a fractional harmonic resonator, in accordance with one or more other example embodiments.

The input impedance matching circuit 110 embodiment depicted in FIG. 1 is a single section T-match circuit. As mentioned previously, however, in an alternate embodiment, the single section T-match circuit may be replaced with an impedance matching circuit in the form of a two-section bandpass circuit. For example, FIG. 2 is a schematic circuit diagram of a power amplifier circuit 200 with an impedance matching circuit in the form of a two-section bandpass circuit 210, along with a fractional harmonic resonator (FHR) circuit 130, in accordance with another example embodiment. To the extent that various elements of FIGS. 1 and 2 are substantially similar or identical, those references utilize the same reference number. For purposes of brevity, descriptions of the substantially similar or identical elements (i.e., those with the same reference number in FIGS. 1 and 2) are not repeated in the context of the description of FIG. 2, but those descriptions are intended to be incorporated into the below description of FIG. 2.

Essentially, the differences between amplifier circuit 100 (FIG. 1) and amplifier circuit 200 (FIG. 2) may be found in the input impedance matching circuits 110, 210. According to the embodiment illustrated in FIG. 2, input impedance matching circuit 210 has a two-section bandpass filter configuration, which includes a first series inductive element 112, a series capacitance 220, a second series inductive element 116, a shunt inductive element 218, and a shunt capacitance 114. According to an embodiment, series inductive element 116 and shunt capacitance 114 form a low-pass filter of the bandpass filter configuration, and shunt inductive element 218 and series capacitance 220 form a high pass filter of the bandpass filter configuration. The bandpass configuration may allow for wideband operation at RF frequencies that would not be as easily achieved with simpler matching networks.

As illustrated in FIG. 2, an FHR circuit 130, which was described previously in conjunction with the description of FIG. 1, is implemented within the input impedance matching circuit 210. More specifically, the FHR circuit 130 is coupled between the first and second inductive elements 112, 116, and even more specifically, the FHR circuit 130 is connected between the second terminal of series capacitance 220 and the first terminal of the second series inductive element 116 (i.e., between nodes 113 and 115).

Again, the input impedance matching circuit 210 and FHR circuit 130 may be referred to collectively as an "input circuit." As will be described in more detail in conjunction with FIGS. 5, 8, and 9, many of the elements making up the input impedance matching circuit 210 and FHR circuit 130, and specifically those elements encompassed by dashed box 280, may be included in and/or on an IPD assembly, such as IPD assemblies 580', 581', FIGS. 5, 8, 9, or in and/or on another type of substrate.

In the input impedance matching circuit 210, the first inductive element 112 (e.g., a first set of bond wires) is coupled between input 102 and node 213. More specifically, a first terminal of inductive element 112 (e.g., first ends of the first set of bond wires) is connected to input 102, and a second terminal of inductive element 112 (e.g., second ends of the first set of bond wires) is connected to node 213. Series capacitance 220 is coupled between node 213 and node 113. More specifically, a first terminal of series capacitance 220 is coupled to node 213, and a second terminal of series capacitance 220 is coupled to node 113. The second inductive element 116 (e.g., a second set of bond wires) is coupled between node 113 and the input terminal 142 of transistor 140. More specifically, a first terminal of inductive element 116 (e.g., first ends of the second set of bond wires) is coupled (e.g., indirectly) to node 113, and a second terminal of inductive element 116 (e.g., second ends of the second set of bond wires) is connected to the control terminal 142. Shunt inductive element 218 is coupled between node 213 and ground (or another voltage reference). More specifically, a first terminal of shunt inductive element 218 is coupled to node 213, and a second terminal of shunt inductive element 218 is coupled to ground. Finally, shunt capacitance 114 is coupled between node 113 and ground (or another voltage reference). More specifically, a first terminal of shunt capacitance 114 is coupled to node 113, and a second terminal of shunt capacitance 114 is coupled to ground.

According to an embodiment, in both input matching networks 110, 210, inductive element 112 may have an inductance value in a range between about 150 picohenries (pH) to about 500 pH, inductive element 116 may have an inductance value in a range between about 50 pH to about 250 pH, and shunt capacitance 114 may have a capacitance value in a range between about 10 picofarads (pF) to about 200 pF. Finally, in input matching network 210, series capacitance 220 may have a capacitance value in a range between about 10 pF) to about 100 pF. In other embodiments, some or all of the above-listed components may have smaller or larger component values than the above-given ranges.

Desirably, shunt capacitance 114 has a relatively large capacitance (e.g., greater than about 60 pF) to provide an RF low-impedance point at node 113 (e.g., to provide an "RF cold point" or a "pseudo-RF cold point" at node 113). In other words, node 113 represents a low impedance point in the circuit for RF signals. According to an embodiment, amplifier circuits 100, 200 also include an input-side baseband termination (BBT) circuit 160 coupled between node 113 (e.g., or another RF low-impedance point at or coupled to node 113) and the ground reference node. The input-side baseband termination circuit 160, which may be located within the same device package as transistor 140 (and thus is considered an in-package baseband termination circuit), may function to improve the low frequency resonance (LFR) of amplifier circuits 100, 200 caused by the interaction between the input matching circuits 110, 210 and the bias feeds (e.g., bias feed 191, described later) by presenting a low impedance at envelope frequencies and/or a high impedance at RF frequencies. The input-side baseband termination circuit 160 essentially may be considered to be "invisible" from an RF matching standpoint, as it primarily effects the impedance at envelope frequencies (i.e., baseband termination circuit 160 provides terminations for the envelope frequencies of amplifier circuits 100, 200). As will be discussed in more detail later in conjunction with FIGS. 3A-3F, the input-side baseband termination circuit 160 may have any of a number of different circuit configurations, in various embodiments. In still other embodiments, the input-side baseband termination circuit 160 may be excluded from amplifier circuits 100, 200, as indicated by the dashed-line connection between node 113 and baseband termination circuit 160.

Referring to both FIGS. 1 and 2, and as mentioned previously, each of amplifier circuits 100, 200 include a fractional harmonic resonator (FHR) circuit 130 coupled between the input 102 and the control terminal 142 of transistor 140. In the embodiments illustrated in FIGS. 1 and 2, FHR circuit 130 is coupled between node 113 and the control terminal 142 of transistor, and more specifically is connected between node 113 and node 115 (or the first terminal of inductance 116). Node 113 may be considered to be an "input" or "input terminal" of the FHR circuit 130, and node 115 may be considered to be an "output" or "output terminal" of the FHR circuit 130. In the embodiments of FIGS. 1 and 2, the FHR circuit 130 is positioned "within" the input impedance matching circuit 110, 210, meaning that components of the input impedance matching circuits 110, 210 are coupled both to the input and to the output of the FHR circuit 130. More specifically, in FIG. 1, capacitive element 114 is coupled to the input (node 113) of the FHR circuit 130, and inductive element 116 is coupled to the output (node 115) of the FHR circuit 130. Similarly, in FIG. 2, capacitive elements 114 and 220 are coupled to the input (node 113) of the FHR circuit 130, and inductive element 116 is coupled to the output (node 115) of the FHR circuit 130.

FHR circuit 130 includes inductive element 132 (e.g., a third set of bond wires or an integrated spiral inductor) and capacitance 134 coupled in parallel between the node 113 and node 115, where node 115 is coupled through inductance 116 to the control terminal 142 of transistor 140. The inductance and capacitance values of inductive element 132 and capacitance 134 are selected so that the parallel combination of inductive element 132 and capacitance 134 generate a high impedance condition (emulating a short circuit) between a fundamental frequency, f0, and a second harmonic frequency, 2f0, and a low impedance condition near 2f0. More specifically, the inductance and capacitance values of inductive element 132 and capacitance 134 are selected so that the FHR circuit 130 resonates at a resonant frequency, fr, that is below the second harmonic frequency operating band, but above the fundamental frequency band (i.e., the harmonic resonator resonates at a resonant frequency between the fundamental frequency and the second harmonic frequency). In other words, the FHR circuit 130 resonates at a resonant frequency, fr, that is a fraction, x, of the fundamental frequency, f0, where the fraction is greater than 1 but less than 2. In other words, the fraction, x, is an improper fraction between 1 and 2. For example but not by way of limitation, the FHR circuit 130 may resonate at a resonant frequency, fr, in a first range between about 1.25 f0 and about 1.9 f0 (i.e., 1.25≤x≤1.9), or in a second range between about 1.4 f0 and about 1.6 f0 (i.e., 1.4≤x≤1.6). In some embodiments, the FHR circuit 130 may resonate at a resonant frequency, fr, of about 1.5 f0 (i.e., x≈1.5). According to an embodiment, the inductance and capacitance values of inductive element 132 ($L_{132}$) and capacitance 134 ($C_{134}$) may be selected according to the following equation:

$$2\pi x f0 = \frac{1}{\sqrt{L_{132} C_{134}}}$$

where x is the fraction of the fundamental frequency, f0, at which the FHR circuit 130 is designed to resonate (i.e., fr=xf0).

As one non-limiting example, when the FHR circuit 130 is designed to resonate at a frequency of 1.5 f0 (i.e., x=1.5) and the fundamental frequency of operation is 2.0 gigahertz (GHz) (which has a second harmonic at 4.0 GHz), inductive element 132 may have an inductance value of about 141 pH, and capacitance 134 may have a capacitance value of about 20 pF. In other implementations, the fundamental frequency may be lower or higher than 2.0 GHz, and the fraction, x, of the fundamental frequency at which the FHR circuit 130 is designed to resonate may be lower or higher than 1.5, in which case the inductance and capacitance values of inductive element 132 and capacitance 134 would be selected to have appropriately different values. According to an embodiment, inductive element 132 may have an inductance value in a range between about 20 pH to about 1 nanohenry (nH), and capacitance 134 may have a capacitance value in a range between about 1 pF to about 300 pF, although these components may have values outside of these ranges, as well.

As stated previously, the FHR circuit 130 is designed to resonate at a frequency, fr, above the fundamental frequency, f0, and below the second harmonic frequency, 2f0. The FHR circuit 130, containing inductance 132 and capacitance 134 coupled in parallel, when resonating at fr, will generate a high impedance between nodes 113 and 115. Consequentially, the control terminal 142 (e.g., gate terminal) of the transistor 140 will be terminated with a high impedance at frequency fr. At frequencies just higher than fr, FHR circuit 130 will behave like a capacitor, and the control terminal 142 of the transistor 140 will be terminated with negative reactance. Reactance tends to increase with frequency in passive-lossless networks, which will ensure the reactance seen at the control terminal 142 will be higher in value at 2f0 than at fr. Because the reactance terminating the control terminal 142 is negative just above fr and will be higher in value at 2f0, when properly designed, a reactance value near zero (i.e., emulating a short circuit) can be achieved at 2f0 at the control terminal 142. Even with losses present in circuit elements at RF frequencies, a low impedance (i.e., an impedance close to a short compared to Ropt of the device) can be achieved. This 2f0 termination is desired for high efficiency operation.

Each of amplifier circuits 100, 200 also optionally (as indicated by the dashed-line bias feed 191) may include a gate terminal bias circuit 190 coupled to node 113, in an embodiment, which may function as a second (out-of-package) baseband termination circuit that is essentially coupled in parallel with the first baseband termination circuit 160. A similarly (or differently) configured drain terminal bias circuit (not shown) may be coupled to the output terminal 144 of transistor 140. Bias circuit 190 includes a bias feed 191 (e.g., a microstrip line), a series-coupled inductive element 192 (e.g., one or more bond wires 692, FIG. 6, coupled in series with a bias lead 592, FIG. 5) and capacitor 196, with an intermediate node 193 between the inductor/capacitor combination. According to an embodiment, inductive element 192 may have an inductance value in a range between about 1500 pH to about 2500 pH, and capacitor 196 may have a capacitance value in a range between about 8,000 nanofarads (nF) to about 12,000 nF, although the inductance and/or capacitance values could be lower or higher, as well.

To provide a gate bias voltage to the input terminal 142 of the transistor 140, an external bias circuit (not shown) may be connected to node 193 (e.g., the distal end of a bias lead), and the bias voltage may be provided through this node. A drain bias voltage may be similarly provided to node 158 by an output-side bias circuit (not shown). In other embodiments, either or both the input-side or output-side bias circuits may be excluded. In such other embodiments, the external bias circuits may be connected instead to the input 102 or to the output 104, and the bias voltage(s) may be provided through the input 102 and/or the output 104.

Referring to FIG. 2, in an embodiment in which the gate bias is provided through the input 102, rather than through gate bias circuit 190, circuit 200 also may include a resistor 122 coupled in parallel with capacitance 220 between nodes 213 and 113, along with a DC blocking capacitor 219 in series with inductance 218. When included, resistor 222 and DC blocking capacitor 219 each are configured to provide high impedance at RF frequencies. According to an embodiment, resistor 222 may have a resistance value in a range of about 50 ohms to about 150 ohms, inductance 218 may have an inductance value in a range between about 100 pH to about 350 pH, and DC blocking capacitor 219 may have a capacitance value in a range of about 50 pF to about 300 pF, although the resistance and capacitance values of these components could be lower or higher, as well. Although FIG. 2 illustrates the third inductive element 218 and the DC blocking capacitor 219 in a particular series arrangement (e.g., with the third inductive element 218 directly connected to node 213), in other embodiments, the order of the third inductive element 218 and the DC blocking capacitor 219 could be reversed (e.g., with the DC blocking capacitor 219 directly connected to node 213, and the third inductive element 218 being coupled between the DC blocking capacitor 219 and ground). Again, and as indicated by depicting resistor 222 and DC blocking capacitor 219 with dashed lines, resistor 222 and DC blocking capacitor 219 may be excluded from circuit 200, for example, in an embodiment in which the gate bias voltage is provided through gate terminal bias circuit 190.

On the output side of amplifier circuits 100, 200, output impedance matching circuit 150 is coupled between the first current conducting terminal 144 (e.g., drain terminal) of transistor 140 and the output 104. Output impedance matching circuit 150 is configured to match the output impedance of amplifier circuits 100, 200 with the input impedance of an external circuit or component (not shown) that may be coupled to output 104. Output impedance matching circuit 150 may have any of a number of different circuit configurations, and just one example is shown in FIGS. 1, 2. More specifically, in the non-limiting example shown in FIGS. 1, 2, output impedance matching circuit 150 includes two inductive elements 152, 154 and shunt capacitance 156. A first inductive element 152 (e.g., a fourth set of bond wires) is coupled between the first current conducting terminal 144 (e.g., drain terminal) of transistor 140 and the output 104. A second inductive element 154 (e.g., a fifth set of bond wires) is coupled between the first current conducting terminal 144 of transistor 140 and a node 158, which corresponds to another RF low-impedance point, in an embodiment. A second terminal of the shunt capacitance 156 is coupled to ground (or to another voltage reference), in an embodiment.

Again, the RF low-impedance point 158 represents a low impedance point in the circuit for RF signals. According to an embodiment, another (output-side) baseband termination (BBT) circuit 162 is coupled between the RF low-impedance point 158 and the ground reference node. Again, baseband termination circuit 162 may function to further improve the LFR of amplifier circuits 100, 200 caused by the interaction between the output impedance matching circuit 150 and the bias feeds (not shown) by presenting a low impedance at envelope frequencies and/or a high impedance at RF frequencies. Baseband termination circuit 162 also may be considered to be "invisible" from an RF matching standpoint.

As will now be described in conjunction with FIGS. 3A-3F, the baseband termination circuits 160, 162 may have any of a number of different circuit configurations, in various embodiments. For example, FIGS. 3A-3F illustrate six example embodiments of baseband termination circuits (e.g., baseband termination circuits 160, 162, FIGS. 1, 2). In each of FIGS. 3A-3F, baseband termination circuit 300, 301, 302, 303, 304, 305 is coupled between a connection node 313 (e.g., node 113 and/or node 158, FIGS. 1, 2) and ground (or another voltage reference). Further, each baseband termination circuit 300-305 includes an envelope inductance 362, $L_{env}$, an envelope resistor 364, $R_{env}$, and an envelope capacitor 366, $C_{env}$, coupled in series between the connection node 313 and ground. In each of FIGS. 3A-3E, a first terminal of envelope inductance 362 is coupled to node 313, and a second terminal of envelope inductance 362 is coupled to node 380. A first terminal of envelope resistor 364 is coupled to node 380, and a second terminal of envelope resistor 364 is coupled to node 382. A first terminal of envelope capacitor 366 is coupled to node 382, and a second terminal of the envelope capacitor 366 is coupled to ground (or another voltage reference). Although the order of the series of components between node 313 and the ground reference node is the envelope inductance 362, the envelope resistor 364, and the envelope capacitor 366 in FIGS. 3A-3E, the order of components in the series circuit could be different, in other embodiments. For example, in FIG. 3F, the envelope resistor 364 is coupled between node 313 and a node 384, the envelope inductance 362 is coupled between node 384 and a node 386, and the envelope capacitor 366 is coupled between node 386 and ground (or another voltage reference).

Referring to FIGS. 3A-3F, and according to an embodiment, the envelope inductance 362, may be implemented as an integrated inductance (e.g., inductance 662, FIGS. 6, 8), as a discrete inductor, and/or as a set of bond wires coupling the connection node 313 to the envelope resistor 364 (e.g., via node 380). For example, and as will be described in detail later, envelope inductance 362 may be integrally formed as a portion of an IPD, such as IPD 580, 580', 581, 581', FIGS. 5-9. For example, envelope inductance 362 may have an inductance value in a range between about 5 pH to about 2000 pH. Desirably, envelope inductance 362 has an inductance value less than about 500 pH (e.g., as low as 50 pH, in an embodiment, or possibly even lower). In other embodiments, the value of envelope inductance 362 may be lower or higher than the above-given range.

Envelope resistor 364 may be implemented as an integrated resistor (e.g., resistor 664, FIGS. 6, 8), in an embodiment, or as a discrete resistor, in another embodiment. For example, envelope resistor 364 may be integrally formed as a portion of an IPD, such as IPD 580, 580', 581, 581', FIGS. 5-9. In some instances, envelope capacitor 366 and envelope inductor 362 may provide additional parasitic resistance which can be considered part of the overall resistance that forms envelope resistor 364. In an embodiment, envelope resistor 364 may have a resistance value in a range between about 0.1 ohm to about 5.0 ohm, although envelope resistor 364 may have a resistance value outside of this range, as well.

Envelope capacitor 366 may be implemented as an integrated capacitor (e.g., capacitor 666, FIGS. 6, 8), in an embodiment, or as a discrete capacitor (e.g., a "chip capacitor"), in another embodiment. For example, envelope capacitor 366 may be integrally formed as a portion of an IPD, such as IPD 580, 580', 581, 581', FIGS. 5-9. In an embodiment, envelope capacitor 366 may have a capacitance value in a range between about 1 nF to about 1 microfarad (µF), although envelope capacitor 366 may have a capacitance value outside of this range, as well.

The first embodiment of baseband termination circuit 300 illustrated in FIG. 3A includes a simple series combination of envelope inductance 362, envelope resistor 364, and envelope capacitor 366. Conversely, in the embodiments of FIGS. 3B-3F, the baseband termination circuit 301-305 may include one or more "bypass" or "parallel" capacitors 368, 370, 372, 374, 376, 378, $C_{para}$, which are coupled in parallel with the envelope inductance 362 and/or the envelope resistor 364. Each of the bypass capacitors 368, 370, 372, 374, 376, 378 may be implemented as a discrete capacitor (e.g., capacitor 678, FIGS. 6, 8), in some embodiments, or as an integrated capacitor, in other embodiments. In each of these embodiments, a bypass capacitor 368, 370, 372, 374, 376, 378 may have a capacitance value in a range between about 3.0 pF to about 1400 pF. In other embodiments, the value of any of bypass capacitors 368, 370, 372, 374, 376, 378 may be lower or higher than the above-given range.

In the baseband termination circuit 301 of FIG. 3B, bypass capacitor 368, $C_{para}$, is coupled in parallel with the envelope inductance 362. More specifically, first terminals of envelope inductance 362 and bypass capacitor 368 are coupled to node 313, and second terminals of envelope inductance 362 and bypass capacitor 368 are coupled to node 380.

In the baseband termination circuit 302 of FIG. 3C, bypass capacitor 370, $C_{para}$, is coupled in parallel with the envelope resistor 364. More specifically, first terminals of envelope resistor 364 and bypass capacitor 370 are coupled to node 380, and second terminals of envelope resistor 364 and bypass capacitor 370 are coupled to node 382.

In the baseband termination circuit 303 of FIG. 3D, bypass capacitor 372, $C_{para}$, is coupled in parallel with the envelope inductance 362 and envelope resistor 364. More specifically, bypass capacitor 372 is coupled across nodes 313 and 382.

In the baseband termination circuit 304 of FIG. 3E, a first bypass capacitor 374, $C_{para1}$, is coupled in parallel with the envelope inductance 362, and a second bypass capacitor 376, $C_{para2}$, is coupled in parallel with the envelope resistor 364. More specifically, first terminals of envelope inductance 362 and first bypass capacitor 374 are coupled to node 313, and second terminals of envelope inductance 362 and first bypass capacitor 374 are coupled to node 380. In addition, first terminals of envelope resistor 364 and second bypass capacitor 376 are coupled to node 380, and second terminals of envelope resistor 364 and second bypass capacitor 376 are coupled to node 382.

Referring to the baseband termination circuits 301, 304, and 305 of FIGS. 3B, 3E, and 3F, parallel-coupled inductance 362 and capacitor 368, 374 or 378 form a parallel resonant circuit at frequencies in proximity to the center operational frequency of the device or circuit (e.g., amplifier circuits 100, 200, FIGS. 1, 2) within which circuit 301, 304 or 305 is incorporated. As used herein, and according to an embodiment, the term "in proximity to the center operating frequency" means "within 20 percent of the center operating frequency." Accordingly, for example, when a device has a center operating frequency of 2.0 gigahertz (GHz), a frequency that is "in proximity to the center operating frequency" corresponds to a frequency that falls in a range from 1.8 GHz to 2.2 GHz. Although 2.0 GHz is given as an example center operating frequency, a device may have a center operating frequency that is different from 2.0 GHz, as well. In alternate embodiments, the term "in proximity to the center operating frequency" may mean "within 10 percent of the center operating frequency" or "within 5 percent of the center operating frequency."

Because $L_{env}//C_{para}$ form a parallel resonant circuit at frequencies in proximity to the center operational frequency of the device, the parallel resonant circuit $L_{env}//C_{para}$ essentially appears as an open circuit to such frequencies. Accordingly, RF energy near the center operational frequency that may be present at the node 313 to which circuit 301, 304 or 305 is coupled will be deflected by the parallel resonant circuit $L_{env}//C_{para}$. This deflection may be provided even using a relatively low inductance value for inductance 362. For these reasons, circuits 301, 304, and 305 may significantly improve the LFR of a device or circuit (e.g., amplifier circuits 100, 200, FIGS. 1, 2) in which it is incorporated by presenting a low impedance at envelope frequencies and a high impedance at RF frequencies.

In each of the embodiments of baseband termination circuits 302, 303, 304 of FIGS. 3C, 3D, and 3E, bypass capacitor 370, 372 or 376 is coupled in parallel with envelope resistor 364. Because capacitor 370, 372 or 376 may function to route RF current around the envelope resistor 364, circuits 302, 303, 304 may result in a reduction in the RF current dissipated by the envelope resistor 364. This characteristic of circuits 302, 303, 304 also may serve to better protect the envelope resistor 364 from potential compromise due to excessive current that may otherwise flow through the envelope resistor 364 in the absence of bypass capacitor 370, 372 or 376.

Each of circuits 301-305 may increase the device efficiency, when compared with circuit 300, since they allow less RF current to flow through (and be dissipated by) the envelope resistor 364. Further, because circuits 301-305 present a high impedance to RF frequencies in proximity to the center operational frequency of a device into which the baseband termination circuit is incorporated, it is not as important for circuits 301-305 to be connected to an RF low-impedance point (e.g., RF low-impedance point 113 or 158, FIGS. 1, 2), although they may be. Instead, the benefits of circuits 301-305 may be achieved even when circuits 301-305 are coupled to a node that shows higher RF impedance. This includes other nodes in both the input and output impedance matching circuits.

Referring again to FIGS. 1 and 2, and as will be described in more detail later in conjunction with FIGS. 5-9, various embodiments of RF amplifier devices may include at least one input-side integrated passive device (IPD) assembly (e.g., IPD assemblies 580, 580', 581, 581', FIGS. 5-9), and at least one output-side IPD assembly (e.g., IPD assemblies 582, 583, FIG. 5). The input-side IPD assembly(ies) (e.g., IPD assemblies 580, 580', 581, 581', FIGS. 5-9) include portions of the input circuit 110, 210, the fractional harmonic resonator circuit 130, and the baseband termination circuit 160. For example, as mentioned previously, some or all of the components encompassed by dashed boxes 180, 280, FIGS. 1, 2 may be included in or on the input-side IPD assemblies. Similarly, the output-side IPD assembly(ies) (e.g., IPD assemblies 582, 583, FIG. 5) include portions of the output circuit 150 and the baseband termination circuit 162. More specifically, each IPD assembly may include a semiconductor substrate with one or more integrated passive components. In several particular embodiments, each input-side IPD assembly may include shunt capacitance 114, shunt inductance 218, shunt capacitance 219, series capacitance 220, resistance 222, FHR circuit inductance 132, FHR circuit capacitance 134, and components of baseband termination circuit 160 (e.g., components 362, 364, 366, 368, 370, 372, 374, 376, 378, FIGS. 3A-3F). In other particular embodiments, each output-side IPD assembly may include shunt capacitance 156, and components of baseband termination circuit 162 (e.g., components 362, 364, 366, 368, 370, 372, 374, 376, 378, FIGS. 3A-3F).

In other embodiments, some portions of the input and output impedance matching circuits 110, 210, 150 and baseband termination circuits 160, 162 may be implemented as distinct/discrete components or as portions of other types of assemblies (e.g., a low-temperature co-fired ceramic (LTCC) device, a small PCB assembly, and so on). In still other embodiments, some portions of the input and/or output impedance matching circuits 110, 210, 150 may be coupled to and/or integrated within the semiconductor die that includes transistor 140. The below, detailed description of embodiments that include IPD assemblies should not be taken to limit the inventive subject matter, and the term "passive device substrate" or "IPD substrate" means any type of structure that includes a passive device, including an IPD, an LTCC device, a transistor die, a PCB assembly, and so on.

Each of the amplifier circuits 100, 200 of FIGS. 1 and 2 may be implemented as a single-path amplifier, which receives an RF signal at input 102, amplifies the signal through transistor 140, and produces an amplified RF signal at output 104. Alternatively, multiple instances of the amplifier circuits 100, 200 may be implemented together to provide a multiple-path amplifier, such as a Doherty power amplifier or another type of multi-path amplifier circuit.

Figure 4:
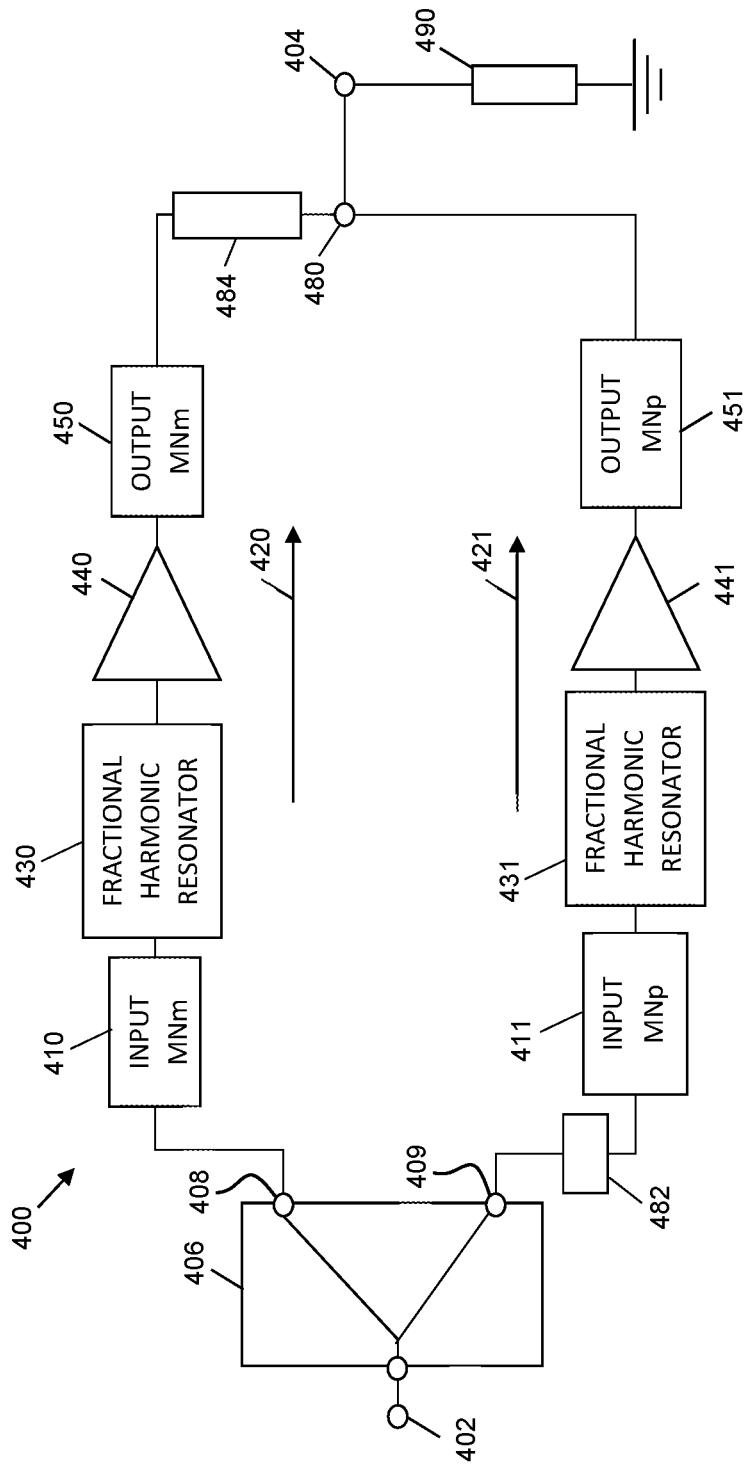
FIG. 4 is a simplified schematic diagram of a Doherty power amplifier, in accordance with one or more example embodiments.

For example, FIG. 4 is a simplified schematic diagram of a Doherty power amplifier (DPA) 400 in which embodiments of amplifier circuit 100 or 200 may be implemented. DPA 400 includes an input node 402, an output node 404, a power divider 406 (or splitter), a main amplifier path 420, a peaking amplifier path 421, and a combining node 480. A load 490 may be coupled to the combining node 480 (e.g., through an impedance transformer, not shown) to receive an amplified RF signal from amplifier 400.

Power divider 406 is configured to divide the power of an input RF signal received at input node 402 into main and peaking portions of the input signal. The main input signal is provided to the main amplifier path 420 at power divider output 408, and the peaking input signal is provided to the peaking amplifier path 421 at power divider output 409. During operation in a full-power mode when both the main and peaking amplifiers 440, 441 are supplying current to the load 490, the power divider 406 divides the input signal power between the amplifier paths 420, 421. For example, the power divider 406 may divide the power equally, such that roughly one half of the input signal power is provided to each path 420, 421 (e.g., for a symmetric Doherty amplifier configuration). Alternatively, the power divider 406 may divide the power unequally (e.g., for an asymmetric Doherty amplifier configuration).

Essentially, the power divider 406 divides an input RF signal supplied at the input node 402, and the divided signals are separately amplified along the main and peaking amplifier paths 420, 421. The amplified signals are then combined in phase at the combining node 480. It is important that phase coherency between the main and peaking amplifier paths 420, 421 is maintained across a frequency band of interest to ensure that the amplified main and peaking signals arrive in phase at the combining node 480, and thus to ensure proper Doherty amplifier operation.

An input impedance matching network 410 (input MNm) (e.g., input impedance matching circuits 110, 210, FIGS. 1, 2) may be implemented at the input of the main amplifier 440. Similarly, an input impedance matching network 411 (input MNp) (e.g., input impedance matching circuits 110, 210, FIGS. 1, 2) may be implemented at the input of the peaking amplifier 441. The matching networks 410, 411 may be used to transform the gate impedances of main amplifier 440 and peaking amplifier 441 to a more desirable system level impedance, as well as manipulate the signal phases to ensure proper Doherty amplifier operation. All or portions of the input matching networks 410, 411 may be implemented inside a power transistor package that includes the main and/or peaking amplifiers 440, 441, or some portions of the input impedance matching networks 410, 411 may be implemented on a PCB or other substrate to which a power transistor package is mounted.

According to various embodiments of the inventive subject matter, DPA 400 also includes fractional harmonic resonator (FHR) circuits 430, 431 (e.g., FHR circuit 130, FIGS. 1, 2) coupled between the inputs of amplifiers 440, 441 and the inputs of the main and peaking amplifier 440, 441. As described previously, the FHR circuits 430, 431 are configured to generate a low impedance condition (emulating a short circuit) near a second harmonic frequency, 2f0, of the DPA 400.

Each of the main amplifier 440 and the peaking amplifier 441 includes one or more single-stage or multiple-stage power transistor integrated circuits (ICs) (or power transistor die) for amplifying an RF signal conducted through the amplifier 440, 441. According to various embodiments, all amplifier stages or a final amplifier stage of either or both the main amplifier 440 and/or the peaking amplifier 441 may be implemented, for example, using a III-V field effect transistor (e.g., a HEMT), such as a GaN FET (or another type of III-V transistor, including a GaAs FET, a GaP FET, an InP FET, or an InSb FET). Where only one of the main amplifier 440 or the peaking amplifier 441 is implemented as a III-V FET, the other amplifier may be implemented as a silicon-based FET (e.g., an LDMOS FET), in some embodiments.

According to an embodiment, the carrier amplifier 440 and the peaking amplifier 441 each include a single-stage amplifier (i.e., an amplifier with a single amplification stage or power transistor). In other embodiments, the carrier amplifier 440 is a two-stage amplifier, which includes a relatively low-power driver amplifier (not shown) and a relatively high-power final-stage amplifier (not shown) connected in a cascade (or series) arrangement between the carrier amplifier input and the carrier amplifier output. In the carrier amplifier cascade arrangement, an output (e.g., drain terminal) of the driver amplifier is electrically coupled to an input (e.g., gate terminal) of the final-stage amplifier. Similarly, the peaking amplifier 441 may include a two-stage amplifier, which includes a relatively low-power driver amplifier (not shown) and a relatively high-power final-stage amplifier (not shown) connected in a cascade arrangement between the peaking amplifier input and the peaking amplifier output. In the peaking amplifier cascade arrangement, an output (e.g., drain terminal) of the driver amplifier is electrically coupled to an input (e.g., gate terminal) of the final-stage amplifier. In other embodiments, each of the carrier amplifier 440 and the peaking amplifier 441 may include more than two, cascade-coupled amplification stages.

Although the main and peaking power transistor ICs may be of equal size (e.g., in a symmetric Doherty configuration), the main and peaking power transistor ICs alternatively may have unequal sizes (e.g., in various asymmetric Doherty configurations). As used herein, the term "size", as it relates to a power transistor IC, refers to the peripheries/current carrying capacities of the power transistors embodied in the IC. In an asymmetric Doherty configuration, the peaking power transistor IC(s) typically are larger than the main power transistor IC(s) by some multiplier. For example, the peaking power transistor IC(s) may be twice the size of the main power transistor IC(s) so that the peaking power transistor IC(s) have twice the current carrying capability of the main power transistor IC(s) (i.e., the peaking and main amplifiers have a peaking-to-main amplifier IC size ratio of 2:1). Peaking-to-main amplifier IC size ratios other than a 2:1 ratio may be implemented, as well.

Output impedance matching network 450 (output MNm) (e.g., output impedance matching circuit 150, FIGS. 1, 2) may be implemented at the output of the main amplifier 440. Similarly, output impedance matching network 451 (output MNp) (e.g., output impedance matching circuit 150, FIGS. 1, 2) may be implemented at the output of the peaking amplifier 441. In each case, the matching networks 450, 451 may be used to transform the drain impedances of main amplifier 440 and peaking amplifier 441 to a more desirable system level impedance, as well as manipulate the signal phases to ensure proper Doherty amplifier operation. All or portions of the output impedance matching networks 450, 451 may be implemented inside a power transistor package that includes the main and/or peaking amplifiers 440, 441, or some portions of the output impedance matching networks 450, 451 may be implemented on a PCB or other substrate to which a power transistor package is mounted.

During operation of DPA 400, the main amplifier 440 is biased to operate in class AB mode (or deep class AB mode), and the peaking amplifier 441 is biased to operate in class C mode (or deep class C mode). In some configurations, the peaking amplifier 156 may be biased to operate in class B or deep class B modes. The main and peaking amplifiers 440, 441 are coupled to the combining node 480 through carrier and peaking output circuits 450, 451, respectively. At low to moderate input signal power levels (i.e., where the power of the input signal at RF input 402 is lower than the turn-on threshold level of peaking amplifier 441), the DPA 400 operates in a low-power mode in which the main amplifier 440 operates to amplify the input signal, and the peaking amplifier 441 is minimally conducting (e.g., the peaking amplifier 441 essentially is in an off state). During this phase of operation, the main output circuit 450 determines the maximum VSWR (voltage standing wave ratio) to which the main amplifier 440 will be exposed. Conversely, as the input signal power increases to a level at which the main amplifier 440 reaches voltage saturation, the power splitter 406 divides the energy of the input signal between the main and peaking amplifier paths 420, 421, and both amplifiers 440, 441 operate to amplify their respective portion of the input signal.

As the input signal level increases beyond the point at which the main amplifier 440 is operating in compression, the peaking amplifier 441 conduction also increases, thus supplying more current to the load 490. In response, the load line impedance of the main amplifier output decreases. In fact, an impedance modulation effect occurs in which the load line of the main amplifier 440 changes dynamically in response to the input signal power (i.e., the peaking amplifier 441 provides active load pulling to the main amplifier 440). The main output circuit 450, which is coupled between the output of the main amplifier 440 and the combining node 480, transforms the main amplifier load line impedance to a high value at backoff, allowing the main amplifier 440 to efficiently supply power to the load 490 over an extended output power range.

DPA 400 has a "non-inverted" load network configuration. In the non-inverted configuration, the input circuit is configured so that an input signal supplied to the peaking amplifier 441 is delayed by 90 degrees with respect to the input signal supplied to the main amplifier 440 at the center frequency of operation, f0, of the amplifier 400. To ensure that the main and peaking input RF signals arrive at the main and peaking amplifiers 440, 441 with about 90 degrees of phase difference, as is fundamental to Doherty amplifier operation, phase delay element 482 applies about 90 degrees of phase delay to the peaking input signal. For example, phase delay element 482 may include a quarter wave transmission line, or another suitable type of delay element with an electrical length of about 90 degrees.

Essentially, the phase delay element 482 compensates for a 90 degree phase delay implemented by a phase shift and impedance transformation element 484 between the output of the main amplifier 440 and the combining node 480. For example, the phase shift and impedance transformation element 484 may include a transmission line coupled between the output of the main amplifier 440 and the combining node 480. Basically, the phase delay element 482 and the phase shift and impedance transformation element 484 equalize the phase shifts applied to the RF signals along the main and peaking amplifier paths 420, 421 to ensure that the amplified signals arrive in phase at the combining node 480.

Alternate embodiments of Doherty amplifiers may have an "inverted" load network configuration. In such a configuration, the input circuit is configured so that an input signal supplied to the main amplifier 440 is delayed by about 90 degrees with respect to the input signal supplied to the peaking amplifier 441 at the center frequency of operation, f0, of the amplifier 400, and the output circuit is configured to apply about a 90 degree phase delay to the signal between the output of peaking amplifier 441 and the combining node 480.

Amplifiers 440 and 441, along with fractional harmonic resonator circuits 430, 431 and portions of matching networks 410, 411, 450, 451 may be implemented in discrete, packaged power amplifier devices. In such devices, input and output leads are coupled to a substrate, and each amplifier 440, 441 may include a single-stage or multi-stage power transistor also coupled to the substrate. Portions of the fractional harmonic resonator circuits 430, 431 and the input and output matching networks 410, 411, 450, 451 may be implemented as additional components within the packaged device. Further, as is described in detail below, the baseband termination circuits (e.g., embodiments of BBT circuits 160, 162, FIGS. 1, 2, illustrated in FIGS. 3A-3F) also may be implemented as additional components within the packaged device.

Figure 5:
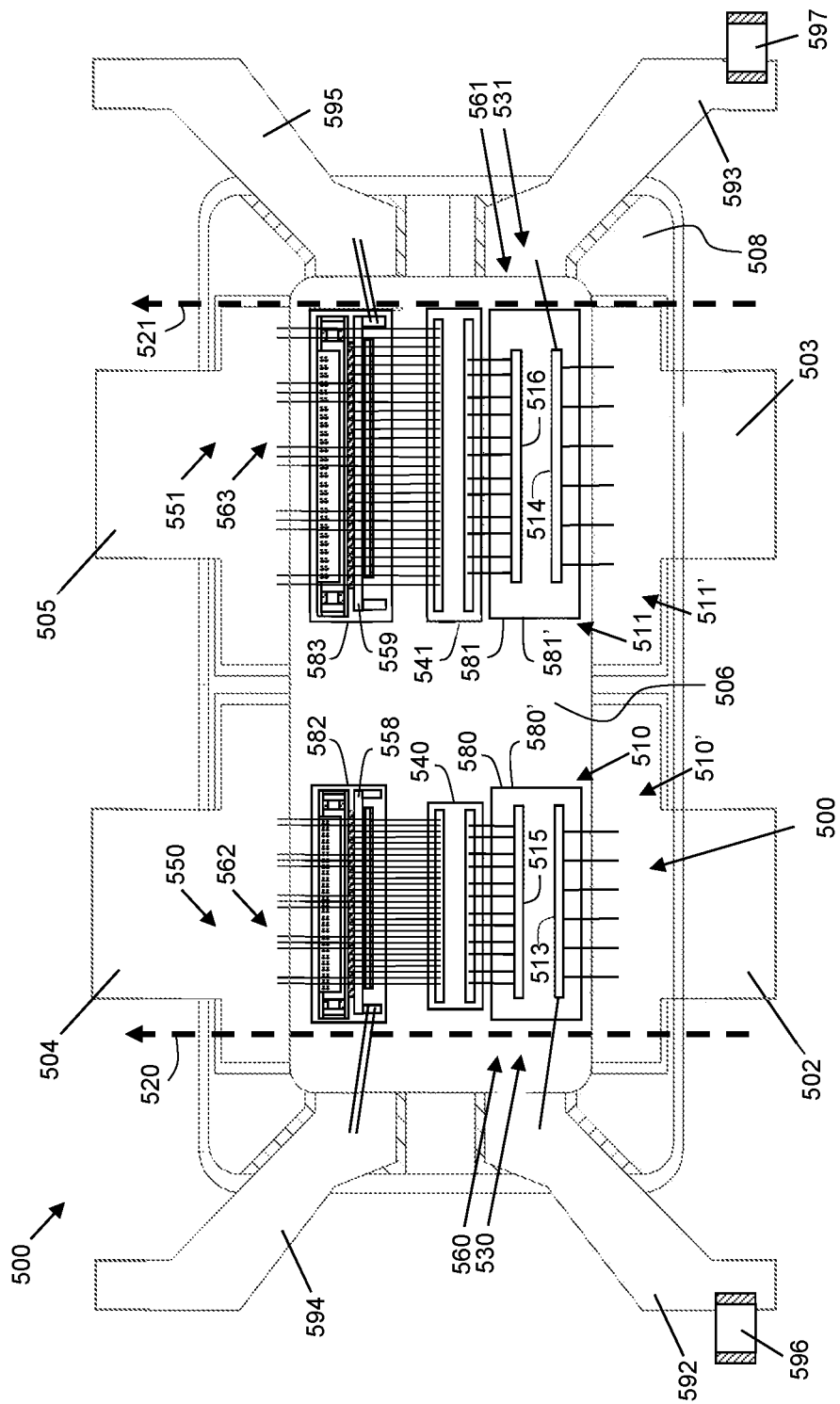
FIG. 5 is a top view of a packaged RF power amplifier device that includes two parallel amplification paths, in accordance with one or more example embodiments.

For example, FIG. 5 is a top view of an embodiment of a packaged RF amplifier device 500 that embodies two parallel instances of either circuit 100 or 200 of FIGS. 1, 2, and which may be utilized to provide amplifiers (e.g., amplifiers 440, 441, FIG. 4), FHR circuits (e.g., FHR circuits 130, FIGS. 1, 2), and all or portions of matching networks (e.g., matching networks 410, 411, 450, 451, FIG. 4) in a Doherty amplifier (e.g., DPA 400, FIG. 4). In addition, as will be described in more detail below, device 500 includes two input-side IPD assemblies 580, 580', 581, 581', each of which includes portions of an input impedance matching circuit 510, 510', 511, 511' (e.g., circuit 110, 210, 410, 411, FIGS. 1, 2, 4), a baseband termination circuit 560, 561 (e.g., circuit 160, FIGS. 1, 2), and a fractional harmonic resonator (FHR) circuit 530, 531 (e.g., circuit 130, 430, 431, FIGS. 1, 2, 4). Further, device 500 includes two output-side IPD assemblies 582, 583, each of which includes portions of an output impedance matching circuit 550, 551 (e.g., circuit 150, 450, 451 FIGS. 1, 2, 4), and a baseband termination circuit 562, 563 (e.g., circuit 162, FIGS. 1, 2).

Device 500 includes a flange 506 (or "device substrate"), in an embodiment, which includes a rigid electrically-conductive substrate with a thickness that is sufficient to provide structural support for various electrical components and elements of device 500. In addition, flange 506 may function as a heat sink for transistor dies 540, 541 and other devices mounted on flange 506. Flange 506 has top and bottom surfaces (only a central portion of the top surface is visible in FIG. 5), and a substantially-rectangular perimeter that corresponds to the perimeter of the device 500.

Flange 506 is formed from an electrically conductive material, and may be used to provide a ground reference node for the device 500. For example, various components and elements may have terminals that are electrically coupled to flange 506, and flange 506 may be electrically coupled to a system ground when the device 500 is incorporated into a larger electrical system. At least the top surface of flange 506 is formed from a layer of conductive material, and possibly all of flange 506 is formed from bulk conductive material.

An isolation structure 508 is attached to the top surface of flange 506, in an embodiment. Isolation structure 508, which is formed from a rigid, electrically insulating material, provides electrical isolation between conductive features of the device (e.g., between leads 502-505, 592-595 and flange 506). Isolation structure 508 has a frame shape, in an embodiment, which includes a substantially enclosed, four-sided structure with a central opening. Isolation structure 508 may have a substantially rectangular shape, as shown in FIG. 5, or isolation structure 508 may have another shape (e.g., annular ring, oval, and so on).

A portion of the top surface of flange 506 that is exposed through the opening in isolation structure 508 is referred to herein as the "active area" of device 500. Transistor dies 540, 541 are positioned within the active device area of device 500, along with IPD assemblies 580 (or 580'), 581 (or 581'), 582, 583, which will be described in more detail later. For example, the transistor dies 540, 541 and IPD assemblies 580-583 may be coupled to the top surface of flange 506 using conductive epoxy, solder, solder bumps, sintering, and/or eutectic bonds.

Device 500 houses two amplification paths (indicated with arrows 520, 521), where each amplification path 520, 521 represents a physical implementation of circuit 100 or 200 (FIGS. 1, 2). When incorporated into a Doherty amplifier (e.g., DPA 400, FIG. 4), amplification path 520 may correspond to a main amplifier path (e.g., main amplifier path 420, FIG. 4), and amplification path 521 may correspond to a peaking amplifier path (e.g., peaking amplifier path 421, FIG. 4). In some instances, the order could be switched, where amplification path 520 may correspond to a peaking amplifier path, and amplification path 521 may correspond to a main amplifier path.

Each path 520, 521 includes an input lead 502, 503 (e.g., input 102, FIGS. 1, 2), an output lead 504, 505 (e.g., output 104, FIGS. 1, 2), one or more transistor dies 540, 541 (e.g., transistor 140, FIGS. 1, 2 or amplifiers 440, 441, FIG. 4), an input impedance matching circuit 510 (or 510'), 511 (or 511') (e.g., input impedance matching circuit 110, 210, FIGS. 1, 2 or portions of input matching networks 410, 411, FIG. 4), an output impedance matching circuit 550, 551 (e.g., output impedance matching circuit 150, FIGS. 1, 2 or portions of output matching networks 450, 451, FIG. 4), an input-side baseband termination circuit 560, 561 (e.g., baseband termination circuit 160, FIGS. 1, 2), an output-side baseband termination circuit 562, 563 (e.g., baseband termination circuit 162, FIGS. 1, 2), an FHR circuit 530, 531 (e.g., FHR circuit 130, 430, 431, FIGS. 1, 2, 4).

The input and output leads 502-505 are mounted on a top surface of the isolation structure 508 on opposed sides of the central opening, and thus the input and output leads 502-505 505 are elevated above the top surface of the flange 506, and are electrically isolated from the flange 506. Generally, the input and output leads 502-505 are oriented to allow for attachment of bond wires between the input and output leads 502-505 and components and elements within the central opening of isolation structure 508.

Each transistor die 540, 541 includes an integrated power FET, where each FET has a control terminal (e.g., a gate terminal) and two current conducting terminals (e.g., a drain terminal and a source terminal). The control terminal of a FET within each transistor die 540, 541 is coupled through an input impedance matching circuit 510 (or 510'), 511 (or 511') and an FHR circuit 530, 531 to an input lead 502, 503. In addition, one current conducting terminal (e.g., the drain terminal) of a FET within each transistor die 540, 541 is coupled through an output impedance matching circuit 550, 551 to an output lead 504, 505. The other current conducting terminal (e.g., the source terminal) of a FET within each transistor die 540, 541 is electrically coupled through the die 540, 541 to the flange 506 (e.g., to ground), in an embodiment.

Embodiments of the input impedance matching circuits 510, 510', 511, 511', baseband termination circuits 560, 561, and FHR circuits 530, 531 will be described in more detail later in conjunction with FIGS. 6-9, which illustrate the components of these circuits 510, 510', 511, 511', 530, 531, 560, 561 in greater detail. As will be explained in conjunction with FIGS. 6-9, some of the components of these circuits may be implemented within IPD assemblies 580 (or 580'), 581 (or 581'). Briefly, each input impedance matching circuit 510 (or 510'), 511 (or 511') is coupled in series with an FHR circuit 530, 531 between an input lead 502, 503 and the control terminal of a FET within a transistor die 540, 541. Each input-side baseband termination circuit 560, 561 is coupled between a node 513, 514 (e.g., node 113, FIGS. 1, 2, such as a conductive bondpad) within IPD assembly 580 (or 580'), 581 (or 581') and a ground reference (e.g., flange 506). Each FHR circuit 530, 531 is coupled between the control terminal (e.g., the gate terminal) of a FET within a transistor die 540, 541 and the input lead 502, 503. Within the IPD assemblies 580 (or 580'), each FHR circuit 530, 531 more specifically is coupled between a first node 513, 514 (e.g., node 113, FIG. 1 or node 213, FIG. 2) and a second node 515, 516 (e.g., node 115, FIGS. 1, 2), where each of the first and second nodes 513, 515 (or 514, 516) may be physically implemented as a conductive bondpad of the IPD assembly 580 (or 580').

Some of the components of the output impedance matching circuits 550, 551, FHR circuits 530, 531, and baseband termination circuits 562, 563 may be implemented within IPD assemblies 582, 583. Briefly, each output impedance matching circuit 550, 551 is coupled between a current conducting terminal (e.g., the drain terminal) of a FET within a transistor die 540, 541' and an output lead 504, 505. Each baseband termination circuit 562, 563 is coupled between a node 558, 559 (e.g., node 158, FIGS. 1, 2 or another RF low-impedance point) within IPD assembly 582, 583 and a ground reference (e.g., flange 506).

In addition to the input and output leads 502-505, device 500 also may include bias circuitry (e.g., including bias circuit 190, FIGS. 1, 2). In the embodiment of FIG. 5, each of the bias circuits include an inductive element (e.g., inductive element 192, FIGS. 1, 2), and each of the input-side (gate) bias circuits further include a capacitor 596, 597 (e.g., capacitor 196, FIGS. 1, 2). For example, each capacitor 596, 597 may be a discrete capacitor (a "chip capacitor") with a first terminal coupled to a distal end of a bias lead 592, 593, and a second terminal coupled to a ground reference node (e.g., on a PCB to which the device 500 is connected).

The inductive element of each bias circuit may include, for example, a series-coupled arrangement of a bias lead 592, 593, 594, 595 and one or more bond wires (e.g., bond wire 692, FIGS. 6, 8) indirectly coupling each bias lead 592-595 to a control terminal (e.g., the gate terminal) or to a current conducting terminal (e.g., the drain terminal) of a FET within each transistor die 540, 541. The distal end of each bias lead 592-595 (corresponding to node 193, FIGS. 1, 2) may be electrically coupled to an external bias circuit (not shown), which provides a bias voltage to the control terminal or current conducting terminal of each FET through the bias lead 592-595. When the gate bias voltage is provided through bias leads 592, 593, the below-described resistors 622 (e.g., resistor 222, FIG. 2) and capacitor 619 (e.g., capacitor 219, FIG. 2) may be excluded from device 500. In other embodiments, either or both the input-side or output-side bias circuits may be excluded. In such embodiments, the external bias circuits may be connected instead to the input leads 502, 503 or to the output leads 504, 505 and the bias voltage(s) may be provided through the input leads 502, 503 and/or the output leads 504, 505.

In the example of FIG. 5, device 500 includes two transistor dies 540, 541 that essentially function in parallel, although another semiconductor device may include a single transistor die or more than two transistor dies, as well. In addition, device 500 includes two input-side IPD assemblies 580 (or 580'), 581 (or 581') and two output-side IPD assemblies 582, 583, which also essentially function in parallel. It is to be understood that more or fewer of IPD assemblies 580-583 may be implemented, as well.

According to an embodiment, device 500 is incorporated in an air cavity package, in which transistor dies 540, 541, the IPD assemblies 580-583, and various other components are located within an enclosed air cavity. Basically, the air cavity is bounded by flange 506, isolation structure 508, and a cap (not shown) overlying and in contact with the isolation structure 508 and leads 502-505, 592-595. In FIG. 5, an exterior perimeter would approximately align with the outer perimeter of flange 506. In other embodiments, the components of device 500 may be incorporated into an overmolded package (i.e., a package in which the electrical components within the active device area are encapsulated with a non-conductive molding compound, and in which portions of the leads 502-505, 592-595 also may be encompassed by the molding compound). In an overmolded package, isolation structure 508 may be excluded.

Figure 6:
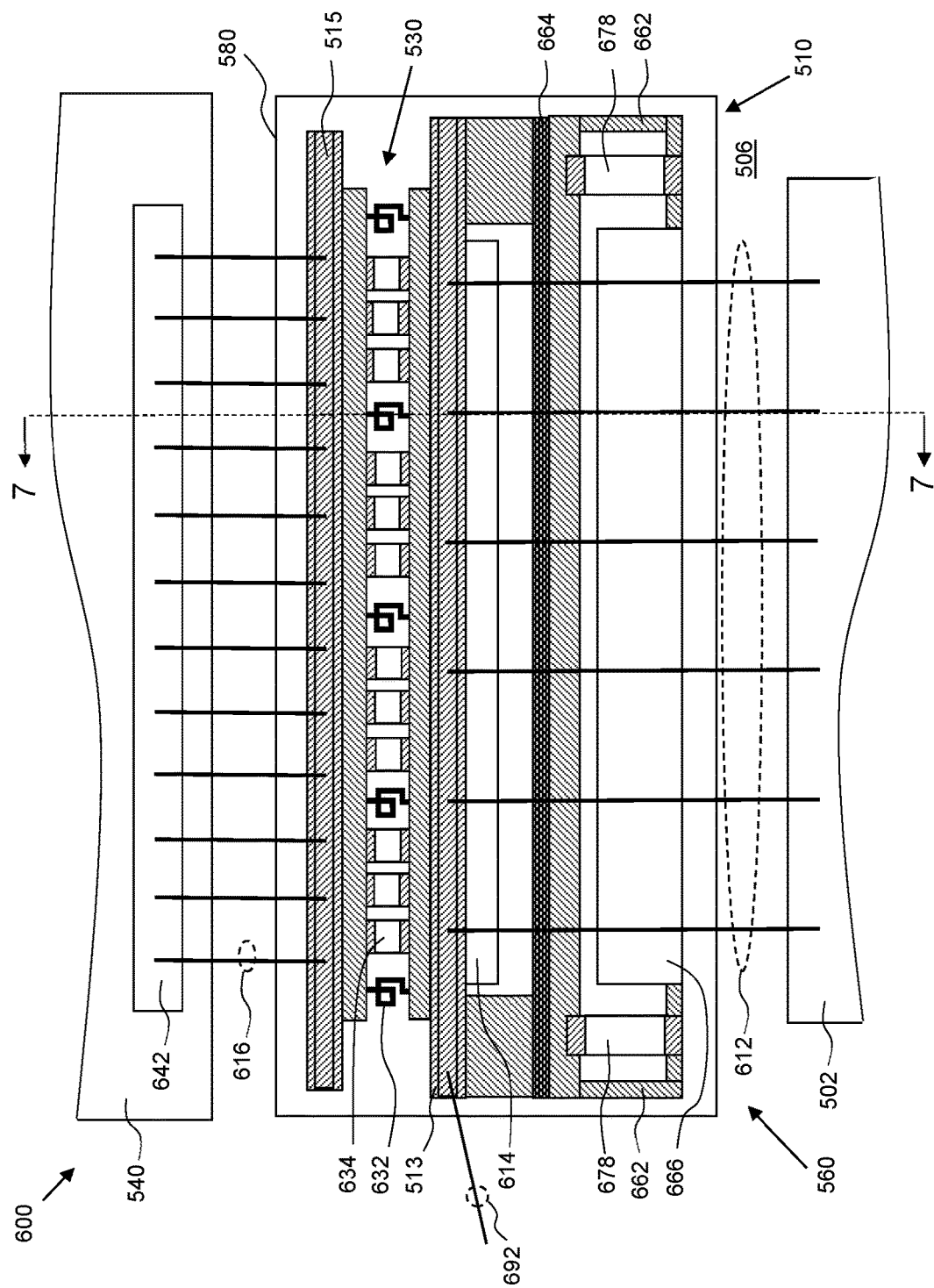
FIG. 6 is a top view of a portion of a packaged RF power amplifier device, including a portion of a power transistor and an input impedance matching circuit, in accordance with one or more example embodiments.
Figure 7:
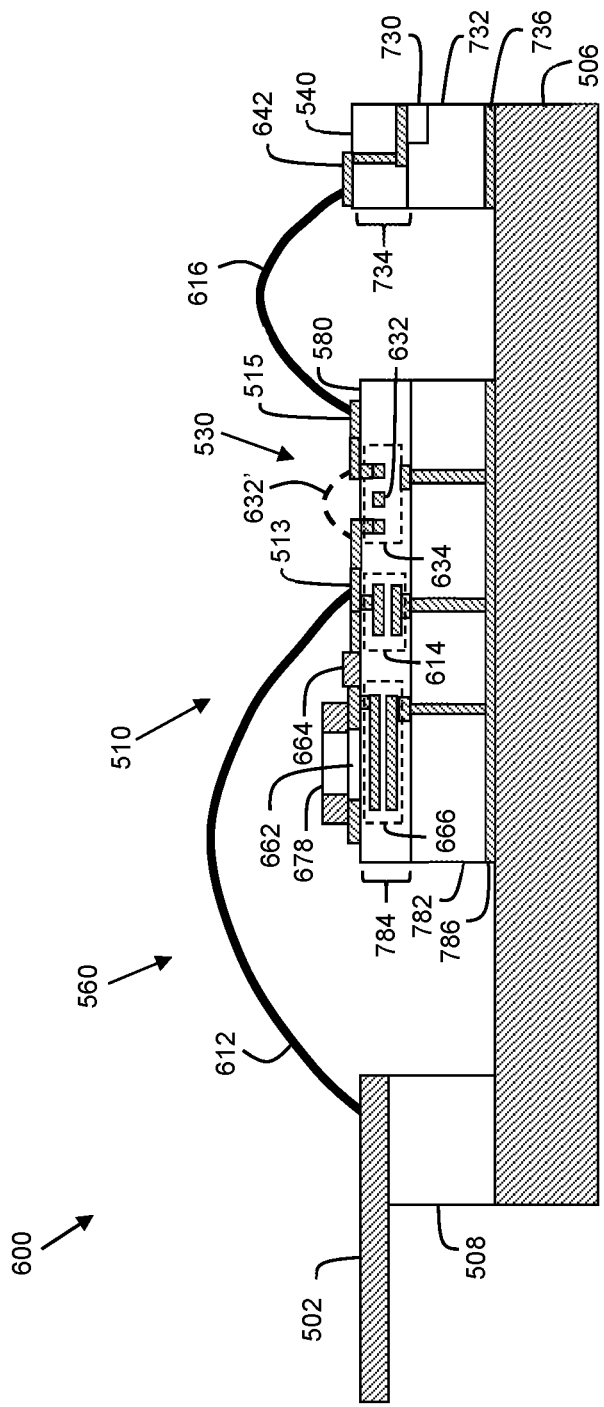
FIG. 7 is a cross-sectional, side view of the portion of the RF power amplifier device of FIG. 6 along line 7-7, in accordance with one or more example embodiments.
Figure 8:
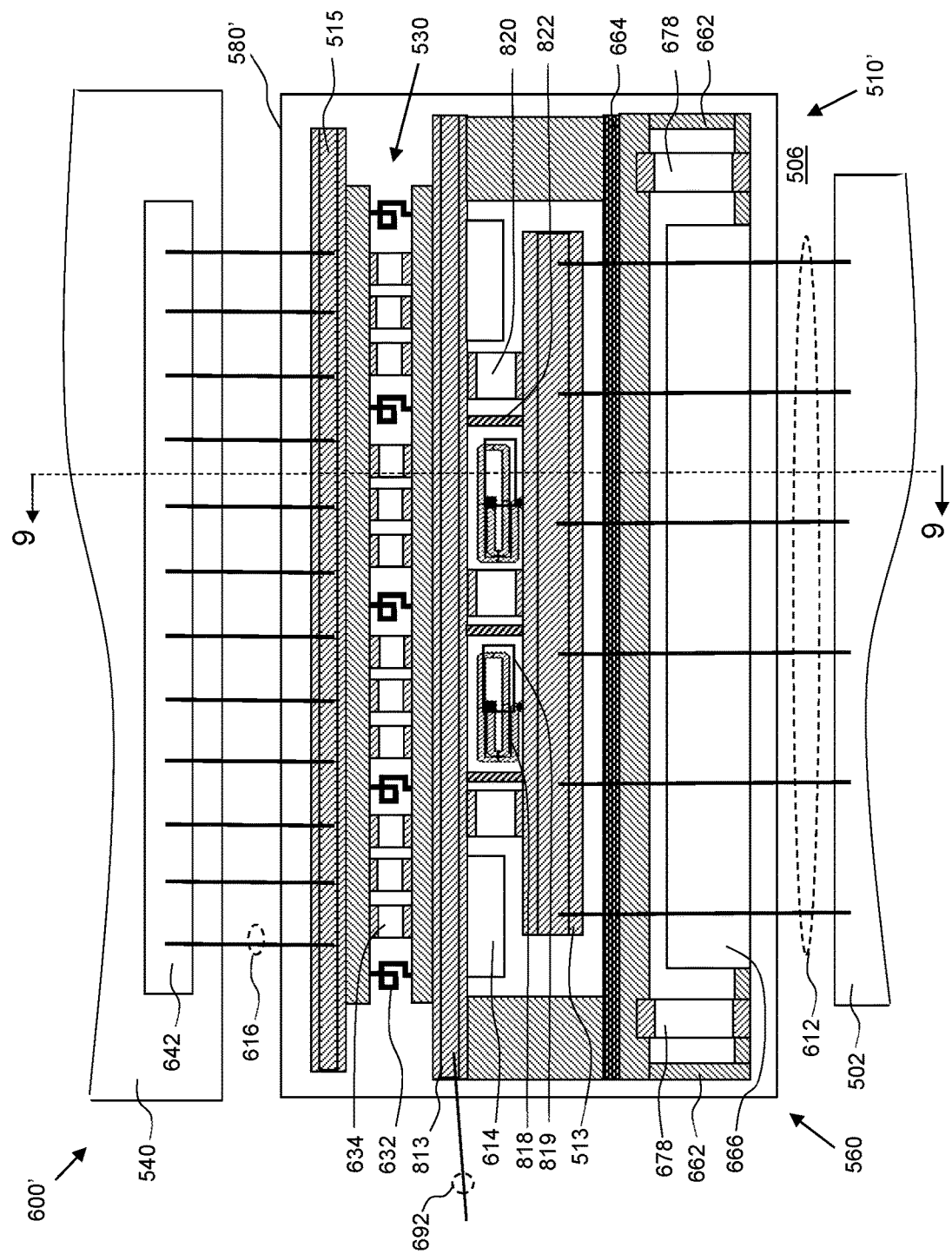
FIG. 8 is a top view of a portion of a packaged RF power amplifier device, including a portion of a power transistor and an input impedance matching circuit, in accordance with one or more other example embodiments.
Figure 9:
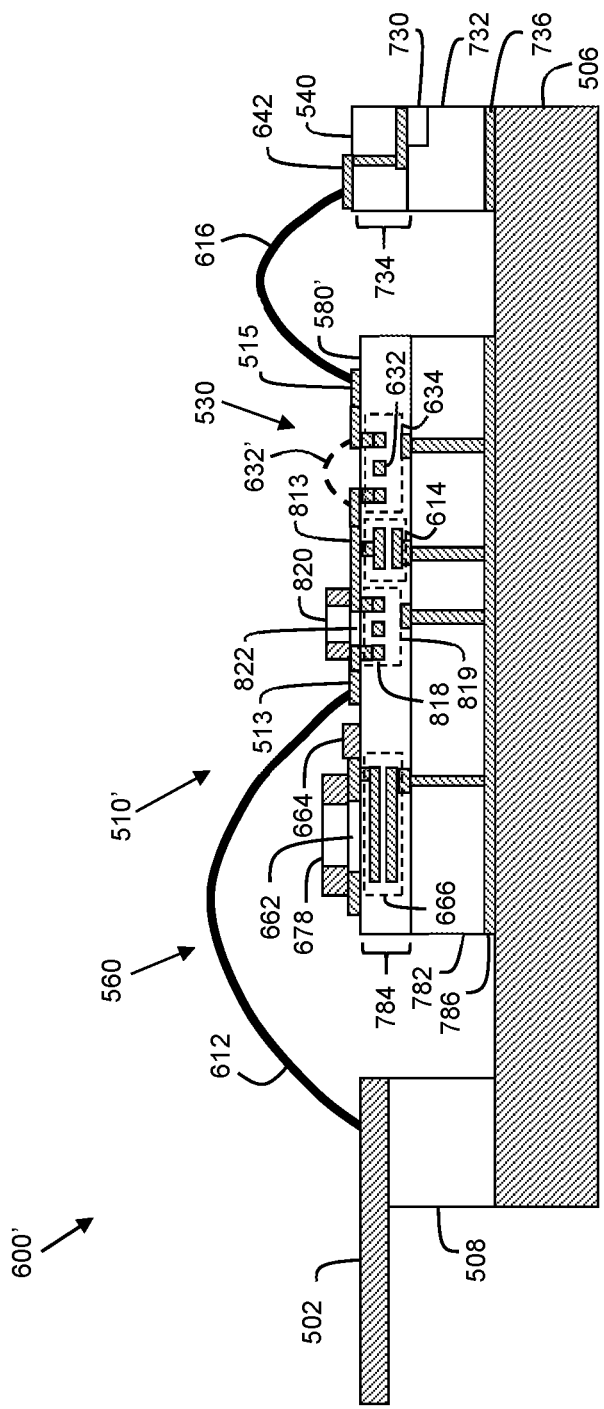
FIG. 9 is a cross-sectional, side view of the portion of the RF power amplifier device of FIG. 8 along line 9-9, in accordance with one or more example embodiments.

Reference is now made to FIGS. 6-9, which include enlarged views of portions of device 500 (FIG. 5) that include two embodiments of an input impedance matching circuit 510, 510', a baseband termination circuit 560, and an FHR circuit 530. More specifically, FIGS. 6 and 7 depict an embodiment that includes a single-section input impedance matching circuit 510 (e.g., input impedance matching circuit 110, 510, FIGS. 1, 5), and FIGS. 8 and 9 depict an embodiment that includes a two-section input impedance matching circuit 510' (e.g., input impedance matching circuit 210, 510', FIGS. 2, 5).

To the extent that there are substantial similarities, both the single-section input impedance matching circuit embodiment (e.g., input impedance matching circuit 110, FIG. 1) and the two-section input impedance matching circuit embodiment (e.g., input impedance matching circuit 210, FIG. 2) will be described together in conjunction with FIGS. 6-9. More specifically, FIGS. 6 and 8 are top views of first and second embodiments, respectively, of the lower-left, input-side portion 600, 600' of packaged RF power amplifier device 500 along amplifier path 520. Portion 600, 600' (FIGS. 6, 8) includes a portion of power transistor die 540, a portion of input lead 502, and input-side IPD assembly 580 or 580' in and on which a single-section input impedance matching circuit (FIGS. 6, 7) or a two-section input impedance matching circuit (FIGS. 8, 9), an FHR circuit 530, and a baseband termination circuit 560 are implemented. For enhanced understanding, FIGS. 7 and 9 include cross-sectional, side views of the portions 600, 600' of the RF power amplifier devices of FIGS. 6 and 8 along line 7-7 and 9-9, respectively. More specifically, FIGS. 7 and 9 are cross-sectional views through input lead 502, IPD assembly 580 or 580', a portion of flange 506, and transistor die 540. As indicated in FIGS. 7 and 9, the power transistor die 540 and the IPD assembly 580 or 580' are coupled to the conductive flange 506, and the input lead 502 is electrically isolated from the conductive flange 506 (e.g., using an isolation structure 508). It should be noted that the input-side portion of the device 500 along amplifier path 521 may be substantially the same as either portion 600 or 600' shown in FIGS. 6-9.

The power transistor die 540 includes a transistor input terminal 642 (e.g., a conductive bondpad), which is electrically connected within the power transistor die 540 to a control terminal (e.g., a gate terminal) of a single-stage or final-stage FET 730 (FIGS. 7, 9) integrated within the die 540. As discussed previously, each FET 730 may include a III-V field effect transistor (e.g., a HEMT), such as a GaN FET (or another type of III-V transistor, including a GaAs FET, a GaP FET, an InP FET, or an InSb FET). More specifically, each FET 730 may be integrally formed in and on a base semiconductor substrate 732 (e.g., a GaN substrate, a GaN-on-silicon substrate, a GaN-on-silicon carbide substrate, and so on). Conductive connections between the control terminal of the FET 730 (e.g., the gate terminal) and the input terminal 642 of the die 540 may be made through a build-up structure 734 of alternating dielectric and patterned conductive layers, where portions of the patterned conductive layers are electrically connected using conductive vias. A conductive layer 736 on a bottom surface of the die 540 may provide a ground node (e.g., for the source terminal, which may be connected to the conductive layer 736 (and thus to the conductive flange 506) using through substrate vias or doped sinker regions (not shown)).

Each of the IPD assemblies 580 (FIGS. 6, 7), 580' (FIGS. 8, 9) also may include a base semiconductor substrate 782 (e.g., a silicon substrate, a silicon carbide substrate, a GaN substrate, or another type of semiconductor substrate, which may be referred to as an "IPD substrate" herein) and a build-up structure 784 of alternating dielectric and patterned conductive layers, where portions of the patterned conductive layers are electrically connected using conductive vias. As will be discussed in more detail below, various electrical components of the input impedance matching circuit 510 or 510' (e.g., impedance matching circuit 110 or 210, FIGS. 1, 2), the baseband termination circuit 560 (e.g., baseband termination circuit 160, FIGS. 1, 2), and the FHR circuit 530 (e.g., FHR circuit 130, FIGS. 1, 2) are integrally formed within and/or connected to the IPD assembly 580, 580'. These electrical components may be electrically connected to conductive bondpads (e.g., bondpads 513, 515, 811) at the top surface of the IPD assembly 580, 580', and also may be electrically connected to ground (or another voltage reference) (e.g., using conductive through substrate vias that extend through the semiconductor substrate 782 to a conductive layer 786 on a bottom surface of the IPD assembly 580, 580'.

In both embodiments illustrated in FIGS. 6-9, the electrical connection between the input lead 502 (e.g., input 102, FIGS. 1, 2) and the IPD assembly 580 or 580' includes a first inductive element 612 (e.g., inductive element 112, FIGS. 1, 2), which may be implemented as a first set of bond wires with first ends coupled to the input lead 502, and second ends coupled to a conductive bondpad 513 (e.g., corresponding to connection node 113, FIG. 1 or connection node 213, FIG. 2) on a top surface of the IPD assembly 580, 580'. Similarly, in both embodiments illustrated in FIGS. 6-9, the electrical connection between the IPD assembly 580 or 580' and the input terminal 642 (e.g., the gate terminal) of the transistor die 540 includes a second inductive element 616 (e.g., inductive element 116, FIGS. 1, 2), which may be implemented as a second set of bond wires with first ends coupled to a conductive bondpad 515 (e.g., corresponding to connection node 115, FIGS. 1, 2) on a top surface of the IPD assembly 580, 580', and second ends coupled to the input terminal 642 of the transistor die 540.

Referring now to FIGS. 6 and 7, an embodiment of an IPD assembly 580 that includes portions of a single-section input impedance matching circuit 510 (e.g., input impedance matching circuit 110, FIG. 1) will now be described. The input impedance matching circuit 510 is a single section T-match circuit, which includes a first inductive element 612 (e.g., inductive element 112, FIG. 1), a shunt capacitor 614 (e.g., shunt capacitance 114, FIG. 1), and a second inductive element 616 (e.g., inductive element 116, FIG. 1).

As mentioned above, the first and second inductive elements 612, 616 each may be implemented as a set of bond wires. The IPD assembly 580 includes conductive bondpads 513, 515 (corresponding to nodes 113, 115, FIG. 1) that are exposed at the top surface of the IPD assembly 580, and the bond wires associated with inductive elements 612 and 616 have ends that are connected to bondpads 513 and 515, respectively. According to an embodiment, inductive element 612 may have an inductance value in a range between about 150 pH to about 500 pH, and inductive element 616 may have an inductance value in a range between about 50 pH to about 250 pH. In other embodiments, either or both of the inductive elements 612, 616 may have smaller or larger inductance values than the above-given ranges.

Shunt capacitor 614 (e.g., shunt capacitance 114, FIG. 1) is coupled between bondpad 513 (e.g., node 113, FIG. 1) and ground (or another voltage reference) (e.g., using conductive through substrate vias that extend through the semiconductor substrate 782 to conductive layer 786 and flange 506). More specifically, a first terminal of shunt capacitor 614 is coupled to bondpad 513, and a second terminal of shunt capacitor 614 is electrically coupled to the conductive flange 506 (e.g., using conductive through substrate vias that extend through the semiconductor substrate 782 to the conductive layer 786 on the bottom surface of IPD assembly 580). The shunt capacitor 614 may be implemented as a metal-insulator-metal (MIM) capacitor (or a set of parallel-coupled MIM capacitors) that is integrally formed as part of the IPD assembly 580. A MIM capacitor includes first and second conductive electrodes (formed from patterned portions of the conductive layers of build-up structure 784) that are aligned with each other and electrically separated by dielectric material of the build-up structure 784. In a more specific embodiment, the first electrode of the shunt capacitor 614 is "directly connected" to the bondpad 513, where "directly connected" means electrically connected, possibly with one or more conductive traces and/or conductive vias, but without intervening circuit elements (i.e., circuit elements that have more than a trace inductance, where a "trace inductance" is an inductance less than about 100 pH). Because the shunt capacitor 614 and the bondpad 513 are "directly connected," and the bondpad 513 also has only a trace inductance, in an embodiment, the bond wires 612 and the shunt capacitor 614 also may be considered to be "directly connected." In an alternate embodiment, the shunt capacitor 614 may be implemented using one or more discrete capacitors coupled to a top surface of the IPD assembly 580, or using another type of capacitor. According to an embodiment, shunt capacitor 614 may have a capacitance value in a range between about 10 pF to about 200 pF, although shunt capacitor 614 may have lower or higher capacitance values, as well.

Referring now to FIGS. 8 and 9, an embodiment of an IPD assembly 580' that includes portions of a two-section input impedance matching circuit 510' (e.g., input impedance matching circuit 210, FIG. 2) will now be described. The input impedance matching circuit 510' has a two-section input bandpass topology, which includes a first inductive element 612 (e.g., inductive element 112, FIG. 2), one or more shunt capacitors 614 (e.g., shunt capacitance 114, FIG. 2), a second inductive element 616 (e.g., inductive element 116, FIG. 2), a shunt inductor 818 (e.g., shunt inductive element 218, FIG. 2), a series capacitor 820 (e.g., series capacitance 220, FIG. 2), an optional resistor 822 (e.g., resistance 222, FIG. 2), and an optional capacitor 819 (e.g., capacitance 219, FIG. 2) in series with shunt inductor 818.

Again, as discussed above, the first and second inductive elements 612, 616 each may be implemented as a set of bond wires. The IPD assembly 580' includes conductive bondpads 513, 515 (corresponding to nodes 213, 115, FIG. 2) that are exposed at the top surface of the IPD assembly 580', and the bond wires associated with inductive elements 612 and 616 have ends that are connected to bondpads 513 and 515, respectively. According to an embodiment, inductive element 612 may have an inductance value in a range between about 150 pH to about 500 pH, and inductive element 616 may have an inductance value in a range between about 50 pH to about 250 pH. In other embodiments, either or both of the inductive elements 612, 616 may have smaller or larger inductance values than the above-given ranges.

One or more shunt inductors 818 (e.g., inductive element 218, FIG. 2) are electrically coupled between bondpad 513 and ground (or another voltage reference) (e.g., using conductive through substrate vias that extend through the semiconductor substrate 782 to conductive layer 786 and flange 506). According to an embodiment, each shunt inductor 818 may be implemented as an integrated spiral inductors formed from a conductive coil that is integrally formed as part of the IPD assembly 580'. According to an embodiment, shunt inductor(s) 818 may have an inductance value in a range between about 100 pH to about 350 pH, although the inductance value may be lower or higher, as well.

In the illustrated embodiment, an optional DC blocking capacitor 819 (e.g., DC blocking capacitor 219, FIG. 2) is coupled in series with each shunt inductor 818 (e.g., between each shunt inductor 818 and ground (or another voltage reference)). However, as described previously, DC blocking capacitor 819 may be excluded when the gate bias voltage is provided through a separate gate bias circuit (e.g., through bias leads 592 and 593). When included, each DC blocking capacitor 819 may be implemented as a MIM capacitor (or a plurality of parallel-coupled MIM capacitors) that is integrally formed as part of the IPD assembly 580'. Alternatively, each DC blocking capacitor 819 may be implemented as one or more discrete capacitors that are connected to a top surface of IPD assembly 580. According to an embodiment, DC blocking capacitor 819 may have a capacitance value in a range of about 50 pF to about 300 pF, although the inductance value may be lower or higher, as well.

A first terminal of the series capacitor 820 (e.g., series capacitance 220, FIG. 2) is coupled directly or indirectly to bondpad 513 (e.g., node 213, FIG. 2), and a second terminal of the series capacitor 820 is coupled directly or indirectly to conductive node 813 (e.g., node 113, FIG. 2). The series capacitor 820 (e.g., series capacitance 220, FIG. 2) may be implemented as a discrete capacitor (or a plurality of parallel-coupled discrete capacitors, as shown in FIG. 8) connected to a top surface of IPD assembly 580'. Alternatively, the series capacitor 820 may be implemented as a MIM capacitor (or a plurality of parallel-coupled MIM capacitors) that is integrally formed as part of the IPD assembly 580'. According to an embodiment, series capacitor 820 may have a capacitance value in a range between about 10 pF to about 100 pF, although the capacitance value may be lower or higher, as well.

In the illustrated embodiment, a plurality of resistors 822 (e.g., resistor 222, FIG. 2) is coupled in parallel with capacitor(s) 820 between bondpad 513 and conductive node 813. However, as described previously, resistors 822 may be excluded when the gate bias voltage is provided through a separate gate bias circuit (e.g., through bias leads 592 and 593). According to an embodiment, when included, each resistor 822 may be integrally formed as part of the IPD assembly 580'. For example, each resistor 822 may be a polysilicon resistor formed from a layer of polysilicon on or within build-up structure 784. According to an embodiment, resistor(s) 822 may have a resistance value in a range of about 50 ohms to about 150 ohms, although the resistance value may be lower or higher, as well.

According to an embodiment, a first electrode (or terminal) of each shunt capacitor 614 (e.g., shunt capacitor 114, FIG. 2) is electrically coupled to the conductive node 813, and a second electrode (or terminal) of each shunt capacitor 614 is electrically coupled to ground (or another voltage reference) (e.g., using conductive through substrate vias that extend through the semiconductor substrate 782 to conductive layer 786 and flange 506). Each shunt capacitor 614 may be implemented as a MIM capacitor (or a set of parallel-coupled MIM capacitors) that is integrally formed as part of the IPD assembly 580'. In an alternate embodiment, each shunt capacitor 614 may be implemented using one or more discrete capacitors coupled to a top surface of the IPD assembly 580', or using another type of capacitor. According to an embodiment, shunt capacitor(s) 614 may have a capacitance value in a range between about 10 pF to about 200 pF, although the capacitance value may be lower or higher, as well.

Referring now to both of the embodiments depicted in FIGS. 6-9, each of IPD assemblies 580, 580' also includes an FHR circuit 530 (e.g., FHR circuit 130, FIGS. 1, 2). As discussed previously in conjunction with FIGS. 1-4, FHR circuit 530 is connected between the input lead 502 (e.g., input 102, FIGS. 1, 2) and the control terminal (e.g., the gate terminal) of FET 730 within transistor die 540. In the embodiments of FIGS. 6-9, the FHR circuit 530 includes a parallel combination of one or more inductors 632 (e.g., inductive element 132, FIGS. 1, 2) and one or more capacitors 634 (e.g., capacitance 134, FIGS. 1, 2), where the inductance and capacitance values of inductor(s) 632 and capacitor(s) 634 are selected so that the parallel combination of inductor(s) 632 and capacitor(s) 634 generate a low impedance condition (emulating a short circuit) near a second harmonic frequency, 2f0. More specifically, the inductance and capacitance values of inductor(s) 632 and capacitor(s) 634 are selected so that the FHR circuit 530 resonates at a frequency that is below the second harmonic frequency operating band, but above the fundamental frequency band (i.e., the harmonic resonator resonates at a frequency between the fundamental frequency and the second harmonic frequency).

According to an embodiment, each of the inductor(s) 632 may be implemented as an integrated spiral inductor formed from a conductive coil that is integrally formed as part of the IPD assembly 580, 580'. In the embodiment of FIGS. 6 and 7, a first terminal (or end) of each inductor 632 is coupled to bondpad 513 (e.g., node 113, FIG. 1), and a second terminal (or end) of each inductor 632 is coupled to bondpad 515 (e.g., node 115, FIG. 1). In addition, a first terminal of each capacitor 634 is coupled to bondpad 513 (e.g., node 113, FIG. 1), and a second terminal of each capacitor 634 is coupled to bondpad 515 (e.g., node 115, FIG. 1). Accordingly, in IPD assembly 580, the inductors 632 and capacitors 634 are coupled in parallel with each other between bondpads 513 and 515.

In the embodiment of FIGS. 8 and 9, a first terminal (or end) of each inductor 632 is coupled to conductive node 813 (e.g., node 113, FIG. 2), and a second terminal (or end) of each inductor 632 is coupled to bondpad 515 (e.g., node 115, FIG. 2). In addition, a first terminal of each capacitor 634 is coupled to conductive node 813 (e.g., node 113, FIG. 2), and a second terminal of each capacitor 634 is coupled to bondpad 515 (e.g., node 115, FIG. 2). Accordingly, in IPD assembly 580', the inductors 632 and capacitors 634 are coupled in parallel with each other between conductive node 813 and bondpad 515.

Although inductors 632 are depicted as integrated spiral inductors in FIGS. 6-9, in other embodiments, inductors 632 may be discrete components, or inductors 632 may be replaced with one or more bond wires 632' (shown dashed to indicate an alternate embodiment), with first ends electrically coupled to bondpad 515 and second ends electrically coupled to bondpad 513 (FIG. 6) or to conductive node 813 (FIG. 8). According to an embodiment, the capacitor(s) 634 of FHR circuit 530 may be implemented as a capacitor that is integrally formed with the IPD substrate of the IPD assembly 580, 580'. For example, each capacitor 634 may be implemented as an integrated MIM capacitor, which includes first and second conductive electrodes (formed from patterned portions of the conductive layers of build-up structure 784) that are aligned with each other and electrically separated by dielectric material of the build-up structure 784. In an alternate embodiment, the capacitor(s) 634 may be implemented using a discrete capacitor coupled to a top surface of the IPD assembly 580, 580', or using another type of capacitor. According to an embodiment, inductor(s) 632 may have an inductance value in a range between about 20 pH to about 1 nH, and capacitor(s) 634 may have a capacitance value in a range between about 1 pF and about 300 pF, although the inductance value and/or capacitance value may be lower or higher, as well.

Each of IPD assemblies 580, 580' also may include a baseband termination circuit 560 (e.g., baseband termination circuit 160, FIGS. 1, 2). Baseband termination circuit 560 may have any one of a number of configurations, in various embodiments, such as but not limited to one of the configurations illustrated in FIGS. 3A-3F. In the embodiments illustrated in FIGS. 6-9, each of the baseband termination circuits 560 have the topology of baseband termination circuit 305 of FIG. 3F. More specifically, in the embodiment of FIGS. 6 and 7, the baseband termination circuit 560 includes a series combination of an envelope resistor 664 (e.g., resistor 364, FIG. 3F), an envelope inductor 662 (e.g., inductor 362, FIG. 3F), and an envelope capacitor 666 (e.g., capacitor 366, FIG. 3F) electrically connected between bondpad 513 (e.g., node 113, 313, FIGS. 1, 3F, which may correspond to or be coupled to an RF low-impedance point) and a ground reference (e.g., flange 506). In the embodiment of FIGS. 8 and 9, the baseband termination circuit 560 includes a series combination of an envelope resistor 664 (e.g., resistor 364, FIG. 3F), an envelope inductor 662 (e.g., inductor 362, FIG. 3F), and an envelope capacitor 666 (e.g., capacitor 366, FIG. 3F) electrically connected between conductive node 813 (e.g., node 113, 313, FIGS. 2, 3F, which may correspond to or be coupled to an RF low-impedance point) and a ground reference (e.g., flange 506).

In addition, each baseband termination circuit 560 includes a bypass capacitor 678 (e.g., bypass capacitor 378, FIG. 3F) connected in parallel with envelope inductor 662. In the embodiments of FIGS. 6 and 8, two instances of the parallel combination of envelope inductor 662 and bypass capacitor 678 are implemented on opposite sides of the IPD assembly 580, 580'. More specifically, the parallel combinations of envelope inductor 662 and capacitor 678 are connected in parallel between envelope resistor 664 and envelope capacitor 666, in the illustrated embodiments. In an alternate embodiment, the baseband termination circuit 560 may include only one instance of the combination of envelope inductor 662 and capacitor 678, or more than two instances of the combination of envelope inductor 662 and capacitor 678.

In the embodiments of FIGS. 6-9, envelope resistor 664 is integrally formed as part of the IPD assembly 580, 580'. For example, each envelope resistor 664 may be a polysilicon resistor formed from a layer of polysilicon on or within build-up structure 784, and electrically coupled between bondpad 513 (FIGS. 6 and 7) or conductive node 813 (FIGS. 8 and 9) and the parallel combination of envelope inductor 662 and bypass capacitor 678. In other alternate embodiments, the envelope resistor 664 may be formed from tungsten silicide or another material, may be a thick or thin film resistor, or may be a discrete component coupled to a top surface of IPD assembly 580, 580'.

The envelope inductor 662 also may be integrally formed as part of the IPD assembly 580, 580', as is illustrated in the embodiments of FIGS. 6-9. For example, each envelope inductor 662 may be a patterned conductor formed from portion(s) of one or more conductive layers of the build-up structure 784, where a first end of the conductor is electrically coupled to envelope resistor 664, and a second end of the conductor is electrically coupled to a first terminal of envelope capacitor 666. In alternate embodiments, each envelope inductor 662 may be implemented as a plurality of bond wires, or as a spiral inductor (e.g., on or proximate to the top surface of IPD assembly 580, 580'), or as a discrete inductor coupled to a top surface of IPD assembly 580, 580'.

Each bypass capacitor 678 is coupled in parallel with each envelope inductor 662, in an embodiment. Each of the bypass capacitors 678 may be, for example, a discrete capacitor that is connected (e.g., using solder, a conductive epoxy, or other means) to a top surface of IPD assembly 580, 580'. More specifically, a first terminal of each bypass capacitor 678 may be electrically coupled to the envelope resistor 664 and to a first terminal of an envelope inductor 662, and a second terminal of each bypass capacitor 678 may be electrically coupled to a second terminal of an envelope inductor 662 and to a first terminal of envelope capacitor 666.

For example, each bypass capacitor 678 may be a multiple-layer capacitor (e.g., a multiple-layer ceramic capacitor) with parallel, interleaved electrodes and wrap-around end terminations. Alternatively, each bypass capacitor 678 may form a portion of a separate IPD (e.g., a MIM capacitor formed on a semiconductor substrate), or may be a capacitor (e.g., a MIM capacitor) that is integrally formed with the semiconductor substrate of the IPD assembly 580, 580'. Alternatively, each bypass capacitor 678 may be implemented as some other type of capacitor capable of providing the desired capacitance for the baseband termination circuit 560.

The envelope capacitor 666 is electrically coupled between a ground reference node (e.g., conductive layer 786 at the bottom surface of each IPD assembly 580, 580') and the parallel combination of envelope inductor 662 and bypass capacitor 678. Capacitor 666 may be a MIM capacitor that is integrally formed with the IPD substrate of IPD assembly 580, 580', for example. In some embodiments, capacitor 666 may be formed in the build-up structure 784 entirely above the semiconductor substrate 782, or capacitor 666 may have portions that extend into the semiconductor substrate 782 or are otherwise coupled to, or in contact with, the semiconductor substrate 782. According to an embodiment, the capacitor 666 may be formed from a first electrode, a second electrode, and dielectric material between the first and second electrodes. The dielectric material of capacitor 666 may include one or more layers of polysilicon, various oxides, a nitride, or other suitable materials. In various embodiments, the first and second electrodes of capacitor 666 may include horizontal portions of conductive layers (e.g., portions that are parallel to the top and bottom surfaces of IPD assembly 580, 580') and/or vertical portions (e.g., portions that are parallel to the sides of IPD assembly 580, 580') of conductive layers that are interconnected. Further, the first and second electrodes of capacitor 666 may be formed from metal layers and/or from conductive semiconductor materials (e.g., polysilicon). Alternatively, envelope capacitor 666 may be a discrete capacitor that is connected (e.g., using solder, a conductive epoxy, or other means) to a top surface of the IPD assembly 580, 580'. Although particular two-plate capacitor structures are shown in FIGS. 7, 9 for capacitors 614, 634, and 666, a variety of other capacitor structures alternatively may be utilized, as would be understood by one of skill in the art based on the description herein.

As also discussed previously, a bias circuit (e.g., bias circuit 190, FIGS. 1, 2) also may be coupled to the control terminal (e.g., gate terminal) of the transistor 730, and in one embodiment, this connection is made through the IPD assembly 580, 580'. More particularly, in an embodiment, the first end of at least one bond wire 692 also may be connected to the conductive bondpad 513 (FIG. 6) or conductive node 813 (FIG. 8), and the second end of bond wire 692 is connected to a bias lead (e.g., bias lead 592, FIG. 5). When a bias voltage is provided by an external bias circuit to the bias lead, the bias voltage may be conveyed through bond wires 692, conductive bondpad 513 or conductive node 813, FHR circuit 530, bond wires 616, and conductive bondpad 642 to the gate terminal of the FET 730 within transistor die 540. According to an embodiment, the series combination of bond wire 692 and the bias lead (e.g., bias lead 592, FIG. 5) may have an inductance value in a range between about 500 pH to about 3000 pH, although the inductance value could be lower or higher, as well.

FIGS. 5-9 illustrate embodiments of RF amplifier devices that include input and output leads coupled to a substrate (e.g., with intervening electrical isolation), and a transistor die also coupled to the substrate between the input and output leads. Such RF amplifier devices may be particularly well suited for high-power amplification. Those of skill in the art would understand, based on the description herein, that the various embodiments may be implemented using different forms of packaging or construction, as well. For example, one or multiple amplification paths that include embodiments of the inventive subject matter could be coupled to a substrate such as a PCB, a no-leads type of package (e.g., a quad-flat no-leads (QFN) package), or another type of package. In such embodiments, inputs and outputs of the amplification path(s) could be implemented using conductive lands or other input/output (I/O) structures. Such implementations may be particularly suitable for lower-power amplification systems, for example, including a relatively low-power Doherty amplifier in which main and peaking amplification paths (including bare transistor dies, IPDs, bias circuits, and so on), a power divider, delay and impedance inversion elements, a combiner, and other components may be coupled to the substrate. It should be understood that implementations of the inventive subject matter are not limited to the illustrated embodiments.

Figure 10:
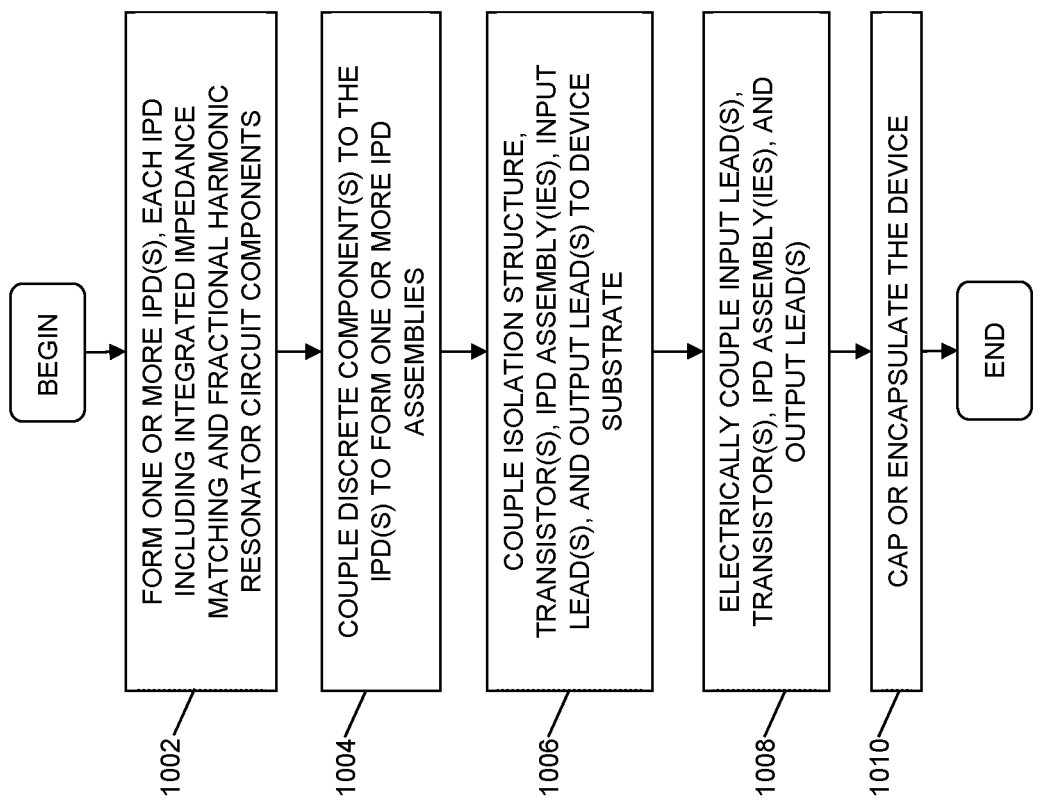
FIG. 10 is a flowchart of a method for fabricating a packaged RF power amplifier device that includes an embodiment of an input impedance matching circuit, in accordance with one or more example embodiments.

FIG. 10 is a flowchart of a method for fabricating a packaged RF power amplifier device (e.g., device 500, FIG. 5) that includes embodiments of input and output impedance matching circuits, input-side and output-side baseband termination circuits, and input-side fractional harmonic resonator circuits (e.g., circuits 300-305, 510, 510', 511, 511', 530, 531, 550, 551, 560-563, FIGS. 3A-3F, 5), in accordance with various example embodiments. The method may begin, in blocks 1002-1004, by forming one or more IPD assemblies. More specifically, in block 1002, one or more input and output IPDs (e.g., IPD 580, 580', 581, 581', 582, 583, FIGS. 5-9) may be formed. According to an embodiment, each input IPD (e.g., IPDs 580, 580', 581, 581') includes components of an impedance matching circuit, a baseband termination circuit, and a fractional harmonic resonator circuit, as described in detail in conjunction with FIGS. 6-9.

In addition to forming the passive components of each IPD, forming each IPD also includes forming various conductive features (e.g., conductive layers and vias), which facilitate electrical connection between the various components of each circuit. For example, forming the IPDs also may include forming various accessible connection nodes at a surface of each IPD substrate. As discussed previously, the connection nodes may include conductive bondpads, which may accept attachment of inductive elements (e.g., bond wires 612, 616, FIGS. 6-9). In addition, in block 1004, when some components corresponding to various circuit elements (e.g., capacitors 614, 634, 666, 678, 820, FIGS. 6-9) are implemented as discrete components (rather than integrated components), those discrete components may be coupled to conductors exposed at the surface of each IPD to form one or more IPD assemblies.

In block 1006, for an air cavity embodiment, an isolation structure (e.g., isolation structure 508, FIG. 5) is coupled to a device substrate (e.g., flange 506). In addition, one or more active devices (e.g., transistor dies 540, 541) and IPD assemblies (e.g., IPD assemblies 580, 580', 581, 581', 582, 583, FIGS. 5-9) are coupled to a portion of the top surface of the substrate that is exposed through an opening in the isolation structure. Leads (e.g., input and output leads 502-505, and bias leads 592-595, if included) are coupled to the top surface of the isolation structure. For overmolded (e.g., encapsulated) device embodiments, the isolation structure may be excluded, and the substrate and leads may form portions of a leadframe.

In block 1008, the input lead(s), transistor(s), IPD assembly(ies), and output lead(s) are electrically coupled together. For example, the electrical connections may be made using bond wires between the various device components and elements, as discussed previously. Some of the bond wires correspond to inductive components of input or output matching circuits (e.g., bond wires 612, 616, FIGS. 5-9), for example. Finally, in block 1010, the device is capped (e.g., for an air cavity package) or encapsulated (e.g., with mold compound for an overmolded package). The device may then be incorporated into a larger electrical system (e.g., a Doherty amplifier or other type of electrical system).

An embodiment of an RF amplifier includes a transistor, an input impedance matching circuit (e.g., a single-section T-match circuit or a multiple-section bandpass circuit), and a fractional harmonic resonator circuit. The input impedance matching circuit is coupled between an amplification path input and a transistor input terminal. An input of the fractional harmonic resonator circuit is coupled to the amplification path input, and an output of fractional harmonic resonator circuit is coupled to the transistor input terminal. The fractional harmonic resonator circuit is configured to resonate at a resonant frequency that is between a fundamental frequency of operation of the RF amplifier and a second harmonic frequency. According to a further embodiment, the fractional harmonic resonator circuit resonates at a fraction, x, of the fundamental frequency, wherein the fraction is between 1.25 and 1.9 (e.g., x≈1.5).

An embodiment of a packaged radio frequency (RF) amplifier device includes a device substrate, input and output leads coupled to the device substrate, a transistor die coupled to the device substrate, an input impedance matching circuit, and a fractional harmonic resonator circuit. The transistor die includes a transistor, a transistor input terminal, and a transistor output terminal coupled to the output lead. The input impedance matching circuit is coupled between the input lead and the transistor input terminal. The fractional harmonic resonator circuit has an input and an output, where the input of the fractional harmonic resonator circuit is coupled to the input lead, and the output of fractional harmonic resonator circuit is coupled to the transistor input terminal. The fractional harmonic resonator circuit is configured to resonate at a resonant frequency that is between a fundamental frequency of operation of the RF amplifier and a second harmonic frequency. According to a further embodiment, the fractional harmonic resonator circuit resonates at a fraction, x, of the fundamental frequency, wherein the fraction is between 1.25 and 1.9 (e.g., x≈1.5).

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio frequency (RF) amplifier comprising:
a transistor having a transistor input terminal;
an input impedance matching circuit that includes a first set of bondwires with first ends coupled to a first input of a first amplification path, and second ends coupled to the transistor input terminal; and
a fractional harmonic resonator circuit having an input and an output, wherein the input of the fractional harmonic resonator circuit is coupled to the first input of the first amplification path, wherein the output of fractional harmonic resonator circuit is coupled to the transistor input terminal, and wherein the fractional harmonic resonator circuit is configured to resonate at a resonant frequency that is between a fundamental frequency of operation of the RF amplifier and a second harmonic of the fundamental frequency.

2. The RF amplifier of claim 1, wherein the fractional harmonic resonator circuit resonates at a fraction, x, of the fundamental frequency, wherein the fraction is between 1.25 and 1.9.

3. The RF amplifier of claim 2, wherein the fraction is between 1.4 and 1.6.

4. The RF amplifier of claim 1, wherein the fractional harmonic resonator circuit is a parallel inductor/capacitor (LC) circuit that comprises:
a first inductive element with a first terminal electrically connected to the first input and a second terminal electrically connected to the transistor input terminal; and
a first capacitance connected in parallel with the first inductive element.

5. The RF amplifier of claim 1, wherein the fractional harmonic resonator circuit is coupled within the input impedance matching circuit.

6. A radio frequency (RF) amplifier comprising:
a transistor having a transistor input terminal;
an input impedance matching circuit coupled between a first input of a first amplification path and the transistor input terminal, wherein the input impedance matching circuit has a single-section T-match topology that comprises:
a first connection node,
a second connection node,
a second capacitance coupled between the first connection node and the ground reference node, and
a second inductive element coupled between the second connection node and the transistor input terminal; and
a fractional harmonic resonator circuit electrically coupled between the first and second connection nodes and having an input and an output, wherein the input of the fractional harmonic resonator circuit is coupled to the first input of the first amplification path, wherein the output of fractional harmonic resonator circuit is coupled to the transistor input terminal, and wherein the fractional harmonic resonator circuit is configured to resonate at a resonant frequency that is between a fundamental frequency of operation of the RF amplifier and a second harmonic of the fundamental frequency.

7. The RF amplifier of claim 6, further comprising:
a third inductive element coupled between the first input and the first connection node.

8. The RF amplifier of claim 7, wherein:
the third inductive element comprises a first plurality of bond wires connected between the first input and the first connection node; and
the second inductive element comprises a second plurality of bond wires connected between the second connection node and the transistor input terminal.

9. A radio frequency (RF) amplifier comprising:
a transistor having a transistor input terminal;
an input impedance matching circuit coupled between a first input of a first amplification path and the transistor input terminal, wherein the input impedance matching circuit has a multiple-section bandpass topology that comprises:
  a first connection node,
  a second connection node,
  a third connection node,
  a second inductive element coupled between the first connection node and a ground reference node,
  a second capacitance coupled between the first connection node and the second connection node,
  a third capacitance coupled between the second connection node and the ground reference node, and
  a third inductive element coupled between the third connection node and the transistor input terminal; and
a fractional harmonic resonator circuit electrically coupled between the second and third connection nodes and having an input and an output, wherein the input of the fractional harmonic resonator circuit is coupled to the first input of the first amplification path, wherein the output of fractional harmonic resonator circuit is coupled to the transistor input terminal, and wherein the fractional harmonic resonator circuit is configured to resonate at a resonant frequency that is between a fundamental frequency of operation of the RF amplifier and a second harmonic of the fundamental frequency.

10. The RF amplifier of claim 9, further comprising:
a fourth inductive element coupled between the first input and the first connection node.

11. The RF amplifier of claim 10, wherein:
the fourth inductive element comprises a first plurality of bond wires connected between the first input and the first connection node; and
the third inductive element comprises a second plurality of bond wires connected between the third connection node and the transistor input terminal.

12. The RF amplifier of claim 11, wherein the input circuit further comprises:
a resistor coupled in parallel with the second capacitance between the first and second connection nodes; and
a DC blocking capacitor coupled in series with the second inductive element between the first connection node and the ground reference node.

13. A radio frequency (RF) amplifier comprising:
a transistor having a transistor input terminal;
an input impedance matching circuit coupled between a first input of a first amplification path and the transistor input terminal;
a fractional harmonic resonator circuit having an input and an output, wherein the input of the fractional harmonic resonator circuit is coupled to the first input of the first amplification path, wherein the output of fractional harmonic resonator circuit is coupled to the transistor input terminal, and wherein the fractional harmonic resonator circuit is configured to resonate at a resonant frequency that is between a fundamental frequency of operation of the RF amplifier and a second harmonic of the fundamental frequency; and
a baseband termination circuit coupled between the input impedance matching circuit and a ground reference node, wherein the baseband termination circuit includes a plurality of components, wherein the plurality of components includes an envelope resistor, an envelope inductor, and an envelope capacitor coupled in series between the input impedance matching circuit and the ground reference node.

14. A radio frequency (RF) amplifier, wherein the RF amplifier is a Doherty power amplifier further comprising:
a transistor having a transistor input terminal;
an input impedance matching circuit coupled between a first input of a first amplification path and the transistor input terminal;
a fractional harmonic resonator circuit having an input and an output, wherein the input of the fractional harmonic resonator circuit is coupled to the first input of the first amplification path, wherein the output of fractional harmonic resonator circuit is coupled to the transistor input terminal, and wherein the fractional harmonic resonator circuit is configured to resonate at a resonant frequency that is between a fundamental frequency of operation of the RF amplifier and a second harmonic of the fundamental frequency;
a second amplification path;
a power divider with a power divider input configured to receive an RF signal, a first output coupled to the first input of the first amplification path, and a second output coupled to a second input of the second amplification path, wherein the power divider is configured to divide the RF signal into a first RF signal that is provided to the first amplification path through the first output, and into a second RF signal that is provided to the second amplification path through the second output; and
a combining node configured to receive and combine amplified RF signals produced by the first and second amplification paths.

15. A packaged radio frequency (RF) amplifier device comprising:
a device substrate;
an input lead coupled to the device substrate;
an output lead coupled to the device substrate;
a transistor die coupled to the device substrate, wherein the transistor die includes a transistor, a transistor input terminal, and a transistor output terminal coupled to the output lead;
an input impedance matching circuit coupled between the input lead and the transistor input terminal; and
a fractional harmonic resonator circuit with an input and an output, wherein the input of the fractional harmonic resonator circuit is coupled to the input lead, wherein the output of fractional harmonic resonator circuit is coupled to the transistor input terminal, and wherein the fractional harmonic resonator circuit is configured to resonate at a resonant frequency that is a fraction, x, of the fundamental frequency, wherein the fraction is between 1.25 and 1.9.

16. The packaged RF amplifier device of claim 15, wherein the fractional harmonic resonator circuit is a parallel inductor/capacitor (LC) circuit that comprises:
a first inductive element with a first terminal electrically connected to the first input and a second terminal electrically connected to the transistor input terminal; and
a first capacitance connected in parallel with the first inductive element.

17. The packaged RF amplifier device claim 15, wherein the input impedance matching circuit has a single-section T-match topology that comprises:
a first connection node;
a second connection node;
a second capacitance coupled between the first connection node and the ground reference node; and a second inductive element coupled between the second connection node and the transistor input terminal, and wherein the fractional harmonic resonator circuit is electrically coupled between the first and second connection nodes.

18. The packaged RF amplifier device of claim 17, further comprising:

an integrated passive device assembly coupled to the device substrate, wherein the first and second connection nodes, the fractional harmonic resonator circuit, and the second capacitance form portions of the integrated passive device assembly.

19. The packaged RF amplifier device of claim 15, wherein the input impedance matching circuit has a multiple-section bandpass topology that comprises:

a first connection node;

a second connection node;

a third connection node;

a second inductive element coupled between the first connection node and a ground reference node;

a second capacitance coupled between the first connection node and the second connection node;

a third capacitance coupled between the second connection node and the ground reference node; and a third inductive element coupled between the third connection node and the transistor input terminal, and wherein the fractional harmonic resonator circuit is electrically coupled between the second and third connection nodes.

20. The packaged RF amplifier device of claim 19, further comprising:

an integrated passive device assembly coupled to the device substrate, wherein the first, second, and third connection nodes, the fractional harmonic resonator circuit, the second inductive element, the second capacitance, and the third capacitance form portions of the integrated passive device assembly.

* * * * *